(12) United States Patent
Tran et al.

(10) Patent No.: US 12,009,228 B2
(45) Date of Patent: *Jun. 11, 2024

(54) LOW TEMPERATURE CHUCK FOR PLASMA PROCESSING SYSTEMS

(71) Applicant: Applied Materials, Inc., Santa Clara, CA (US)

(72) Inventors: Toan Q. Tran, San Jose, CA (US); Zilu Weng, San Diego, CA (US); Dmitry Lubomirsky, Cupertino, CA (US); Satoru Kobayashi, Sunnyvale, CA (US); Tae Seung Cho, San Jose, CA (US); Soonam Park, Sunnyvale, CA (US); Son M. Phi, Milpitas, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/175,104

(22) Filed: Feb. 27, 2023

(65) Prior Publication Data

US 2023/0223281 A1 Jul. 13, 2023

Related U.S. Application Data

(63) Continuation of application No. 15/581,497, filed on Apr. 28, 2017, now Pat. No. 11,594,428, which is a
(Continued)

(51) Int. Cl.
*H01L 21/67* (2006.01)
*H01J 37/32* (2006.01)
(Continued)

(52) U.S. Cl.
CPC .. *H01L 21/67069* (2013.01); *H01J 37/32715* (2013.01); *H01L 21/3065* (2013.01);
(Continued)

(58) Field of Classification Search
None
See application file for complete search history.

(56) References Cited

U.S. PATENT DOCUMENTS 2,369,620 A 2/1945 Sullivan et al.
2,652,686 A 9/1953 Kobayashi et al.
(Continued)

FOREIGN PATENT DOCUMENTS

CN 1124364 A 6/1996
CN 1358324 A 7/2002
(Continued)

OTHER PUBLICATIONS

Daintith et al. (Daintith, John Martin, Elizabeth. (2010). Dictionary of Science (6th Edition)—coaxial cable. (p. 173). Oxford University Press. herein after "Daintith" (Year: 2010).*
(Continued)

*Primary Examiner* — Ram N Kackar
*Assistant Examiner* — Laureen Chan
(74) *Attorney, Agent, or Firm* — Kilpatrick Townsend & Stockton LLP

(57) ABSTRACT

A wafer chuck assembly includes a puck, a shaft and a base. The puck includes an electrically insulating material that defines a top surface of the puck; a plurality of electrodes are embedded within the electrically insulating material. The puck also includes an inner puck element that forms one or more channels for a heat exchange fluid, the inner puck element being in thermal communication with the electrically insulating material, and an electrically conductive plate disposed proximate to the inner puck element. The shaft
(Continued)

includes an electrically conductive shaft housing that is electrically coupled with the plate, and a plurality of connectors, including electrical connectors for the electrodes. The base includes an electrically conductive base housing that is electrically coupled with the shaft housing, and an electrically insulating terminal block disposed within the base housing, the plurality of connectors passing through the terminal block.

19 Claims, 5 Drawing Sheets

Related U.S. Application Data continuation of application No. 14/612,857, filed on Feb. 3, 2015, now abandoned.

(51) Int. Cl.
*H01L 21/3065* (2006.01)
*H01L 21/683* (2006.01)
*H01L 21/687* (2006.01)
*H01L 21/311* (2006.01)

(52) U.S. Cl.
CPC .. *H01L 21/67103* (2013.01); *H01L 21/67248* (2013.01); *H01L 21/6831* (2013.01); *H01L 21/68757* (2013.01); *H01L 21/68785* (2013.01); *H01L 21/68792* (2013.01); *H01L 21/31116* (2013.01); *H01L 21/31138* (2013.01)

(56) References Cited

U.S. PATENT DOCUMENTS

| | | |
|---|---|---|
| 3,401,302 A | 9/1968 | Thorpe et al. |
| 3,451,840 A | 6/1969 | Hough |
| 3,537,474 A | 11/1970 | Rohrer |
| 3,756,511 A | 9/1973 | Shinroku et al. |
| 3,937,857 A | 2/1976 | Brummett et al. |
| 3,969,077 A | 7/1976 | Hill |
| 4,006,047 A | 2/1977 | Brummett et al. |
| 4,147,571 A | 4/1979 | Stringfellow et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,285,762 A | 8/1981 | Moustakas |
| 4,294,952 A | 10/1981 | Mukoyama et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,543,110 A | 9/1985 | Engelhardt et al. |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,600,464 A | 7/1986 | Desilets et al. |
| 4,610,775 A | 9/1986 | Phifer |
| 4,610,887 A | 9/1986 | Pierre et al. |
| 4,619,894 A | 10/1986 | Bozler et al. |
| 4,625,678 A | 12/1986 | Shioya et al. |
| 4,632,857 A | 12/1986 | Mallory, Jr. |
| 4,632,901 A | 12/1986 | Valkirs et al. |
| 4,656,052 A | 4/1987 | Satou et al. |
| 4,656,076 A | 4/1987 | Vetanen et al. |
| 4,668,335 A | 5/1987 | Mockler et al. |
| 4,690,746 A | 9/1987 | McInerney et al. |
| 4,714,520 A | 12/1987 | Gwozdz |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,098 A | 3/1989 | Davis et al. |
| 4,816,638 A | 3/1989 | Ukai et al. |
| 4,818,326 A | 4/1989 | Liu et al. |
| 4,820,377 A | 4/1989 | Davis et al. |
| 4,828,649 A | 5/1989 | Davis et al. |
| 4,838,990 A | 6/1989 | Jucha et al. |
| 4,848,400 A | 7/1989 | Grant et al. |
| 4,851,370 A | 7/1989 | Doklan et al. |
| 4,857,140 A | 8/1989 | Loewenstein |
| 4,865,685 A | 9/1989 | Palmour |
| 4,867,841 A | 9/1989 | Loewenstein et al. |
| 4,872,947 A | 10/1989 | Wang et al. |
| 4,877,482 A | 10/1989 | Knapp et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Loewenstein et al. |
| 4,913,929 A | 4/1990 | Moslehi et al. |
| 4,919,750 A | 4/1990 | Bausmith et al. |
| 4,931,354 A | 6/1990 | Wakino et al. |
| 4,946,903 A | 8/1990 | Gardella, Jr. et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,016,332 A | 5/1991 | Reichelderfer et al. |
| 5,028,565 A | 7/1991 | Chang et al. |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,081,069 A | 1/1992 | Parker et al. |
| 5,083,030 A | 1/1992 | Stavov |
| 5,089,441 A | 2/1992 | Moslehi |
| 5,089,442 A | 2/1992 | Olmer |
| 5,110,407 A | 5/1992 | Ono et al. |
| 5,125,360 A | 6/1992 | Nakayama et al. |
| 5,147,692 A | 9/1992 | Bengston |
| 5,148,714 A | 9/1992 | Mcdiarmid |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchaikit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |

(56) References Cited

U.S. PATENT DOCUMENTS

| | | |
|---|---|---|
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya et al. |
| 5,270,125 A | 12/1993 | America et al. |
| 5,271,972 A | 12/1993 | Kwok et al. |
| 5,274,917 A | 1/1994 | Corbett, III et al. |
| 5,275,977 A | 1/1994 | Otsubo et al. |
| 5,277,750 A | 1/1994 | Frank |
| 5,279,669 A | 1/1994 | Lee |
| 5,279,705 A | 1/1994 | Tanaka |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,318,668 A | 6/1994 | Tamaki et al. |
| 5,319,247 A | 6/1994 | Matsuura |
| 5,326,427 A | 7/1994 | Jerbic |
| 5,328,218 A | 7/1994 | Brusasco et al. |
| 5,328,558 A | 7/1994 | Kawamura |
| 5,328,810 A | 7/1994 | Lowrey et al. |
| 5,330,578 A | 7/1994 | Sakama et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,364,488 A | 11/1994 | Minato et al. |
| 5,366,585 A | 11/1994 | Robertson et al. |
| 5,368,897 A | 11/1994 | Kurihara et al. |
| 5,375,299 A | 12/1994 | Nagano et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,393,708 A | 2/1995 | Hsia et al. |
| 5,399,237 A | 3/1995 | Keswick et al. |
| 5,399,529 A | 3/1995 | Homma |
| 5,403,434 A | 4/1995 | Moslehi |
| 5,412,180 A | 5/1995 | Coombs et al. |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,426,076 A | 6/1995 | Moghadam |
| 5,429,995 A | 7/1995 | Nishiyama et al. |
| 5,439,553 A | 8/1995 | Grant et al. |
| 5,443,647 A | 8/1995 | Aucoin et al. |
| 5,451,169 A | 9/1995 | Corbett, III et al. |
| 5,451,259 A | 9/1995 | Krogh |
| 5,453,124 A | 9/1995 | Moslehi et al. |
| 5,464,499 A | 11/1995 | Moslehi et al. |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,556,521 A | 9/1996 | Ghanbari |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,569,350 A | 10/1996 | Osada et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,385 A | 12/1996 | Paranjpe et al. |
| 5,580,421 A | 12/1996 | Hiatt et al. |
| 5,587,014 A | 12/1996 | Tyechika et al. |
| 5,591,269 A | 1/1997 | Arami et al. |
| 5,592,358 A | 1/1997 | Shamouilian et al. |
| 5,595,606 A | 1/1997 | Fujikawa et al. |
| 5,597,439 A | 1/1997 | Salzman |
| 5,599,740 A | 2/1997 | Jang et al. |
| 5,605,637 A | 2/1997 | Shan et al. |
| 5,614,055 A | 3/1997 | Fairbairn et al. |
| 5,616,518 A | 4/1997 | Foo et al. |
| 5,622,784 A | 4/1997 | Okaue et al. |
| 5,624,582 A | 4/1997 | Cain |
| 5,626,922 A | 5/1997 | Miyanaga et al. |
| 5,628,829 A | 5/1997 | Foster et al. |
| 5,630,881 A | 5/1997 | Ogure et al. |
| 5,635,086 A | 6/1997 | Warren, Jr. et al. |
| 5,635,409 A | 6/1997 | Moslehi |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,665,643 A | 9/1997 | Shin |
| 5,670,066 A | 9/1997 | Barnes et al. |
| 5,674,787 A | 10/1997 | Zhao et al. |
| 5,676,758 A | 10/1997 | Hasegawa et al. |
| 5,679,606 A | 10/1997 | Wang et al. |
| 5,683,518 A | 11/1997 | Moore et al. |
| 5,685,946 A | 11/1997 | Fathauer et al. |
| 5,688,331 A | 11/1997 | Aruga et al. |
| 5,691,009 A | 11/1997 | Sandhu |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Tyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,767,478 A | 6/1998 | Walters |
| 5,770,097 A | 6/1998 | O'Neill et al. |
| 5,772,770 A | 6/1998 | Suda et al. |
| 5,781,693 A | 7/1998 | Ballance et al. |
| 5,786,263 A | 7/1998 | Perera |
| 5,786,276 A | 7/1998 | Brooks et al. |
| 5,788,825 A | 8/1998 | Park et al. |
| 5,789,300 A | 8/1998 | Fulford, Jr. |
| 5,792,376 A | 8/1998 | Kanai et al. |
| 5,798,176 A | 8/1998 | Kitaori et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawili |
| 5,820,723 A | 10/1998 | Benjamin et al. |
| 5,824,599 A | 10/1998 | Schacham-Diamand et al. |
| 5,830,805 A | 11/1998 | Shacham-Diamand et al. |
| 5,835,334 A | 11/1998 | McMillin et al. |
| 5,838,055 A | 11/1998 | Kleinhenz et al. |
| 5,843,538 A | 12/1998 | Ehrsam et al. |
| 5,843,847 A | 12/1998 | Pu et al. |
| 5,844,195 A | 12/1998 | Fairbairn et al. |

(56) References Cited

U.S. PATENT DOCUMENTS

| | | | |
|---|---|---|---|
| 5,846,332 | A | 12/1998 | Zhao et al. |
| 5,846,373 | A | 12/1998 | Pirkle et al. |
| 5,846,375 | A | 12/1998 | Gilchrist et al. |
| 5,846,598 | A | 12/1998 | Semkow et al. |
| 5,849,639 | A | 12/1998 | Molloy et al. |
| 5,850,105 | A | 12/1998 | Dawson et al. |
| 5,853,607 | A | 12/1998 | Zhao et al. |
| 5,855,681 | A | 1/1999 | Maydan et al. |
| 5,855,685 | A | 1/1999 | Tobe et al. |
| 5,856,240 | A | 1/1999 | Sinha et al. |
| 5,858,876 | A | 1/1999 | Chew |
| 5,863,376 | A | 1/1999 | Wicker et al. |
| 5,865,896 | A | 2/1999 | Nowak et al. |
| 5,866,483 | A | 2/1999 | Shiau et al. |
| 5,868,897 | A | 2/1999 | Ohkawa |
| 5,872,052 | A | 2/1999 | Iyer |
| 5,872,058 | A | 2/1999 | Van Cleemput et al. |
| 5,882,414 | A | 3/1999 | Fong et al. |
| 5,882,424 | A | 3/1999 | Taylor et al. |
| 5,882,786 | A | 3/1999 | Nassau et al. |
| 5,883,012 | A | 3/1999 | Chiou et al. |
| 5,885,358 | A | 3/1999 | Maydan et al. |
| 5,885,404 | A | 3/1999 | Kim et al. |
| 5,885,749 | A | 3/1999 | Huggins et al. |
| 5,888,906 | A | 3/1999 | Sandhu et al. |
| 5,891,349 | A | 4/1999 | Tobe et al. |
| 5,891,513 | A | 4/1999 | Dubin et al. |
| 5,897,751 | A | 4/1999 | Makowiecki et al. |
| 5,899,752 | A | 5/1999 | Hey et al. |
| 5,900,163 | A | 5/1999 | Yi et al. |
| 5,902,407 | A | 5/1999 | deBoer et al. |
| 5,904,827 | A | 5/1999 | Reynolds |
| 5,907,790 | A | 5/1999 | Kellam |
| 5,910,340 | A | 6/1999 | Uchida et al. |
| 5,913,140 | A | 6/1999 | Roche et al. |
| 5,913,147 | A | 6/1999 | Dubin et al. |
| 5,913,978 | A | 6/1999 | Kato et al. |
| 5,915,190 | A | 6/1999 | Pirkle |
| 5,918,116 | A | 6/1999 | Chittipeddi |
| 5,919,332 | A | 7/1999 | Koshiishi et al. |
| 5,920,792 | A | 7/1999 | Lin |
| 5,926,722 | A | 7/1999 | Jang et al. |
| 5,926,737 | A | 7/1999 | Ameen et al. |
| 5,928,528 | A | 7/1999 | Kubota et al. |
| 5,932,077 | A | 8/1999 | Reynolds |
| 5,933,757 | A | 8/1999 | Yoshikawa et al. |
| 5,935,334 | A | 8/1999 | Fong et al. |
| 5,935,340 | A | 8/1999 | Xia et al. |
| 5,937,308 | A | 8/1999 | Gardner et al. |
| 5,937,323 | A | 8/1999 | Orczyk et al. |
| 5,939,831 | A | 8/1999 | Fong et al. |
| 5,942,075 | A | 8/1999 | Nagahata et al. |
| 5,944,049 | A | 8/1999 | Beyer et al. |
| 5,944,902 | A | 8/1999 | Redeker et al. |
| 5,948,702 | A | 9/1999 | Rotondaro |
| 5,951,601 | A | 9/1999 | Lesinski et al. |
| 5,951,776 | A | 9/1999 | Selyutin et al. |
| 5,951,896 | A | 9/1999 | Mahawili |
| 5,953,591 | A | 9/1999 | Ishihara et al. |
| 5,953,635 | A | 9/1999 | Andideh |
| 5,961,850 | A | 10/1999 | Satou et al. |
| 5,963,840 | A | 10/1999 | Xia et al. |
| 5,968,379 | A | 10/1999 | Zhao et al. |
| 5,968,587 | A | 10/1999 | Frankel |
| 5,968,610 | A | 10/1999 | Liu et al. |
| 5,969,422 | A | 10/1999 | Ting et al. |
| 5,976,327 | A | 11/1999 | Tanaka |
| 5,982,100 | A | 11/1999 | Ghanbari |
| 5,990,000 | A | 11/1999 | Hong et al. |
| 5,990,013 | A | 11/1999 | Berenguer et al. |
| 5,993,916 | A | 11/1999 | Zhao et al. |
| 5,994,209 | A | 11/1999 | Meh et al. |
| 5,997,649 | A | 12/1999 | Hillman |
| 5,997,962 | A | 12/1999 | Ogasawara et al. |
| 6,004,884 | A | 12/1999 | Abraham |
| 6,007,635 | A | 12/1999 | Mahawili |
| 6,007,785 | A | 12/1999 | Liou |
| 6,008,515 | A | 12/1999 | Hsia et al. |
| 6,009,830 | A | 1/2000 | Li et al. |
| 6,010,962 | A | 1/2000 | Liu et al. |
| 6,013,191 | A | 1/2000 | Nasser-Faili et al. |
| 6,013,584 | A | 1/2000 | M'Saad |
| 6,014,979 | A | 1/2000 | Van Autryve et al. |
| 6,015,724 | A | 1/2000 | Yamazaki |
| 6,015,747 | A | 1/2000 | Lopatin et al. |
| 6,017,414 | A | 1/2000 | Koemtzopoulos et al. |
| 6,019,848 | A | 2/2000 | Frankel et al. |
| 6,020,271 | A | 2/2000 | Yanagida |
| 6,021,785 | A | 2/2000 | Grutzediek et al. |
| 6,022,446 | A | 2/2000 | Shan et al. |
| 6,024,044 | A | 2/2000 | Law et al. |
| 6,030,666 | A | 2/2000 | Lam et al. |
| 6,030,881 | A | 2/2000 | Papasouliotis et al. |
| 6,035,101 | A | 3/2000 | Sajoto et al. |
| 6,036,878 | A | 3/2000 | Collins |
| 6,037,018 | A | 3/2000 | Jang et al. |
| 6,037,266 | A | 3/2000 | Tao et al. |
| 6,037,273 | A | 3/2000 | Gronet et al. |
| 6,039,834 | A | 3/2000 | Tanaka et al. |
| 6,039,851 | A | 3/2000 | Iyer |
| 6,050,085 | A | 4/2000 | Mayer |
| 6,053,982 | A | 4/2000 | Halpin et al. |
| 6,059,643 | A | 5/2000 | Hu et al. |
| 6,063,683 | A | 5/2000 | Wu |
| 6,063,712 | A | 5/2000 | Gilton et al. |
| 6,065,424 | A | 5/2000 | Shacham-Diamand et al. |
| 6,065,425 | A | 5/2000 | Takaki et al. |
| 6,072,147 | A | 6/2000 | Koshiishi et al. |
| 6,072,227 | A | 6/2000 | Yau et al. |
| 6,074,512 | A | 6/2000 | Collins et al. |
| 6,074,514 | A | 6/2000 | Bjorkman et al. |
| 6,077,384 | A | 6/2000 | Collins et al. |
| 6,077,386 | A | 6/2000 | Smith, Jr. et al. |
| 6,077,412 | A | 6/2000 | Ting et al. |
| 6,077,780 | A | 6/2000 | Dubin |
| 6,079,356 | A | 6/2000 | Umotoy et al. |
| 6,080,446 | A | 6/2000 | Tobe et al. |
| 6,080,529 | A | 6/2000 | Ye et al. |
| 6,081,414 | A * | 6/2000 | Flanigan ........... H01J 37/32532 279/128 |
| 6,083,344 | A | 7/2000 | Hanawa et al. |
| 6,083,844 | A | 7/2000 | Bui-Le et al. |
| 6,086,677 | A | 7/2000 | Umotoy et al. |
| 6,087,243 | A | 7/2000 | Wang |
| 6,087,278 | A | 7/2000 | Kim et al. |
| 6,090,212 | A | 7/2000 | Mahawili |
| 6,090,723 | A | 7/2000 | Thakur et al. |
| 6,093,457 | A | 7/2000 | Okumura et al. |
| 6,093,594 | A | 7/2000 | Yeap et al. |
| 6,099,697 | A | 8/2000 | Hausmann |
| 6,107,199 | A | 8/2000 | Allen et al. |
| 6,110,530 | A | 8/2000 | Chen et al. |
| 6,110,556 | A | 8/2000 | Bang et al. |
| 6,110,832 | A | 8/2000 | Morgan, III et al. |
| 6,110,836 | A | 8/2000 | Cohen et al. |
| 6,110,838 | A | 8/2000 | Loewenstein |
| 6,113,771 | A | 9/2000 | Landau et al. |
| 6,114,216 | A | 9/2000 | Meh et al. |
| 6,114,219 | A | 9/2000 | Spikes, Jr. et al. |
| 6,117,245 | A | 9/2000 | Mandrekar et al. |
| 6,120,640 | A | 9/2000 | Shih et al. |
| 6,124,003 | A | 9/2000 | Mikami et al. |
| 6,126,753 | A | 10/2000 | Shinriki et al. |
| 6,132,512 | A | 10/2000 | Horie et al. |
| 6,136,163 | A | 10/2000 | Cheung et al. |
| 6,136,165 | A | 10/2000 | Moslehi |
| 6,136,685 | A | 10/2000 | Narwankar et al. |
| 6,136,693 | A | 10/2000 | Chan et al. |
| 6,140,234 | A | 10/2000 | Uzoh et al. |
| 6,140,242 | A | 10/2000 | Oh et al. |
| 6,143,158 | A | 11/2000 | Nishino et al. |
| 6,144,099 | A | 11/2000 | Lopatin et al. |
| 6,146,970 | A | 11/2000 | Witek et al. |
| 6,147,009 | A | 11/2000 | Grill et al. |

(56) References Cited

U.S. PATENT DOCUMENTS

| | | |
|---|---|---|
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,156,394 A | 12/2000 | Schultz Yamasaki et al. |
| 6,156,581 A | 12/2000 | Vaudo et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,834 A | 12/2000 | Agarwal et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp et al. |
| 6,171,661 B1 | 1/2001 | Zheng et al. |
| 6,174,450 B1 | 1/2001 | Patrick et al. |
| 6,174,810 B1 | 1/2001 | Islam et al. |
| 6,174,812 B1 | 1/2001 | Hsiung et al. |
| 6,176,198 B1 | 1/2001 | Kao et al. |
| 6,176,667 B1 | 1/2001 | Fairbairn et al. |
| 6,177,245 B1 | 1/2001 | Ward et al. |
| 6,178,919 B1 | 1/2001 | Li et al. |
| 6,179,924 B1 | 1/2001 | Zhao et al. |
| 6,180,490 B1 | 1/2001 | Vassiliev et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,187,682 B1 | 2/2001 | Denning et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,151 B1 | 3/2001 | Kaji et al. |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,620 B1 | 3/2001 | Moslehi |
| 6,203,657 B1 | 3/2001 | Collison et al. |
| 6,203,863 B1 | 3/2001 | Liu et al. |
| 6,204,200 B1 | 3/2001 | Shieh et al. |
| 6,207,587 B1 | 3/2001 | Li et al. |
| 6,210,486 B1 | 4/2001 | Mizukami et al. |
| 6,217,658 B1 | 4/2001 | Orczyk et al. |
| 6,220,201 B1 | 4/2001 | Nowak et al. |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,242,360 B1 * | 6/2001 | Fischer ............. H01J 37/32082 156/345.44 |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,284,666 B1 | 9/2001 | Naeem et al. |
| 6,287,643 B1 | 9/2001 | Powell et al. |
| 6,287,962 B1 | 9/2001 | Lin |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos et al. |
| 6,303,418 B1 | 10/2001 | Cha et al. |
| 6,306,246 B1 | 10/2001 | Melvin et al. |
| 6,306,772 B1 | 10/2001 | Lin et al. |
| 6,308,776 B1 | 10/2001 | Sloan et al. |
| 6,310,755 B1 | 10/2001 | Kholodenko et al. |
| 6,312,554 B1 | 11/2001 | Ye |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,329,297 B1 | 12/2001 | Balish et al. |
| 6,335,261 B1 | 1/2002 | Natzle et al. |
| 6,335,288 B1 | 1/2002 | Kwan et al. |
| 6,339,997 B1 | 1/2002 | Nakagawa et al. |
| 6,340,435 B1 | 1/2002 | Bjorkman et al. |
| 6,342,733 B1 | 1/2002 | Hu et al. |
| RE37,546 E | 2/2002 | Mahawili |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson et al. |
| 6,351,013 B1 | 2/2002 | Luning et al. |
| 6,352,081 B1 | 3/2002 | Lu et al. |
| 6,355,573 B1 | 3/2002 | Okumura et al. |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,364,958 B1 | 4/2002 | Lai et al. |
| 6,372,657 B1 | 4/2002 | Hineman et al. |
| 6,375,748 B1 | 4/2002 | Yudovsky et al. |
| 6,376,386 B1 | 4/2002 | Oshima |
| 6,379,575 B1 | 4/2002 | Mn et al. |
| 6,383,896 B1 | 5/2002 | Kirimura et al. |
| 6,383,951 B1 | 5/2002 | Li |
| 6,383,954 B1 | 5/2002 | Wang et al. |
| 6,387,182 B1 | 5/2002 | Horie et al. |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,406,677 B1 | 6/2002 | Carter et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno et al. |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,446,572 B1 | 9/2002 | Brcka |
| 6,447,636 B1 | 9/2002 | Qian et al. |
| 6,447,651 B1 | 9/2002 | Ishikawa et al. |
| 6,448,187 B2 | 9/2002 | Yau et al. |
| 6,448,537 B1 | 9/2002 | Nering |
| 6,450,117 B1 | 9/2002 | Murugesh et al. |
| 6,458,718 B1 | 10/2002 | Todd |
| 6,461,974 B1 | 10/2002 | Ni et al. |

(56) References Cited

U.S. PATENT DOCUMENTS

| | | |
|---|---|---|
| 6,462,371 B1 | 10/2002 | Weimer et al. |
| 6,462,372 B1 | 10/2002 | Wu |
| 6,463,782 B1 | 10/2002 | Shen et al. |
| 6,464,795 B1 | 10/2002 | Sherstinsky et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,465,372 B1 | 10/2002 | Xia et al. |
| 6,469,283 B1 | 10/2002 | Burkhart et al. |
| 6,471,779 B1 | 10/2002 | Nishio et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,557 B1 | 1/2003 | Joret |
| 6,503,843 B1 | 1/2003 | Xia et al. |
| 6,506,253 B2 | 1/2003 | Sakuma |
| 6,506,291 B2 | 1/2003 | Tsai et al. |
| 6,508,879 B1 | 1/2003 | Hashimoto |
| 6,509,283 B1 | 1/2003 | Thomas |
| 6,509,623 B2 | 1/2003 | Zhao |
| 6,514,377 B1 | 2/2003 | Morimoto |
| 6,516,815 B1 | 2/2003 | Stevens et al. |
| 6,518,548 B2 | 2/2003 | Sugaya et al. |
| 6,524,931 B1 | 2/2003 | Perera |
| 6,527,968 B1 | 3/2003 | Wang et al. |
| 6,528,332 B2 | 3/2003 | Mahanpour et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,531,377 B2 | 3/2003 | Knorr et al. |
| 6,534,395 B2 | 3/2003 | Werkhoven et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,544,900 B2 | 4/2003 | Raaijmakers et al. |
| 6,547,977 B1 | 4/2003 | Yan et al. |
| 6,548,416 B2 | 4/2003 | Han et al. |
| 6,548,899 B2 | 4/2003 | Ross |
| 6,551,924 B1 | 4/2003 | Dalton et al. |
| 6,555,183 B2 | 4/2003 | Wang et al. |
| 6,558,564 B1 | 5/2003 | Loewenhardt et al. |
| 6,559,026 B1 | 5/2003 | Rossman et al. |
| 6,565,661 B1 | 5/2003 | Nguyen |
| 6,565,729 B2 | 5/2003 | Chen et al. |
| 6,566,278 B1 | 5/2003 | Harvey et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,576,151 B2 | 6/2003 | Vereecke et al. |
| 6,583,063 B1 | 6/2003 | Khan et al. |
| 6,585,851 B1 | 7/2003 | Ohmi et al. |
| 6,586,163 B1 | 7/2003 | Okabe et al. |
| 6,589,868 B2 | 7/2003 | Rossman |
| 6,596,599 B1 | 7/2003 | Guo |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,614,181 B1 | 9/2003 | Harvey et al. |
| 6,616,967 B1 | 9/2003 | Test |
| 6,624,064 B1 | 9/2003 | Sahin et al. |
| 6,627,532 B1 | 9/2003 | Gaillard et al. |
| 6,630,413 B2 | 10/2003 | Todd |
| 6,635,575 B1 | 10/2003 | Xia et al. |
| 6,635,578 B1 | 10/2003 | Xu et al. |
| 6,638,810 B2 | 10/2003 | Bakli et al. |
| 6,638,855 B1 | 10/2003 | Chang et al. |
| 6,645,301 B2 | 11/2003 | Sainty |
| 6,645,303 B2 | 11/2003 | Frankel et al. |
| 6,645,550 B1 | 11/2003 | Cheung et al. |
| 6,645,805 B2 | 11/2003 | Kil et al. |
| 6,656,540 B2 | 12/2003 | Sakamoto et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,660,391 B1 | 12/2003 | Rose et al. |
| 6,660,662 B2 | 12/2003 | Ishikawa et al. |
| 6,663,715 B1 | 12/2003 | Yuda et al. |
| 6,670,284 B2 | 12/2003 | Yin |
| 6,673,200 B1 | 1/2004 | Gu et al. |
| 6,676,751 B2 | 1/2004 | Solomon et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,683,364 B2 | 1/2004 | Oh et al. |
| 6,688,375 B1 | 2/2004 | Turner et al. |
| 6,706,334 B1 | 3/2004 | Kobayashi et al. |
| 6,713,356 B1 | 3/2004 | Skotnicki et al. |
| 6,713,835 B1 | 3/2004 | Horak et al. |
| 6,716,770 B2 | 4/2004 | O'Neill et al. |
| 6,717,189 B2 | 4/2004 | Inoue et al. |
| 6,720,213 B1 | 4/2004 | Gambino et al. |
| 6,733,620 B1 | 5/2004 | Sugiyama et al. |
| 6,736,147 B2 | 5/2004 | Satoh et al. |
| 6,736,987 B1 | 5/2004 | Cho |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,085 B2 | 6/2004 | Waldfried et al. |
| 6,756,235 B1 | 6/2004 | Liu et al. |
| 6,758,224 B2 | 7/2004 | Nogami |
| 6,759,261 B2 | 7/2004 | Shimokohbe et al. |
| 6,762,126 B2 | 7/2004 | Cho et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fischer |
| 6,772,827 B2 | 8/2004 | Keller et al. |
| 6,779,481 B2 | 8/2004 | Kent et al. |
| 6,783,627 B1 | 8/2004 | Mahawili et al. |
| 6,787,191 B2 | 9/2004 | Hanahata et al. |
| 6,792,889 B2 | 9/2004 | Nakano et al. |
| 6,793,733 B2 | 9/2004 | Janakiraman et al. |
| 6,794,290 B1 | 9/2004 | Papasouliotis et al. |
| 6,794,311 B2 | 9/2004 | Huang et al. |
| 6,796,314 B1 | 9/2004 | Graff |
| 6,797,189 B2 | 9/2004 | Hung et al. |
| 6,797,634 B2 | 9/2004 | Suzuki |
| 6,800,336 B1 | 10/2004 | Foernsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,812,157 B1 | 11/2004 | Gadgil |
| 6,815,633 B1 | 11/2004 | Chen et al. |
| 6,818,517 B1 | 11/2004 | Maes |
| 6,818,561 B1 | 11/2004 | Sonderman |
| 6,819,886 B2 | 11/2004 | Runkowske et al. |
| 6,821,571 B2 | 11/2004 | Huang |
| 6,823,589 B2 | 11/2004 | White et al. |
| 6,826,451 B2 | 11/2004 | del Puerto et al. |
| 6,828,241 B2 | 12/2004 | Kholodenko et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,835,995 B2 | 12/2004 | Li |
| 6,838,684 B2 | 1/2005 | Bakker et al. |
| 6,846,745 B1 | 1/2005 | Papasouliotis et al. |
| 6,849,854 B2 | 2/2005 | Sainty |
| 6,852,550 B2 | 2/2005 | Tuttle et al. |

(56) References Cited

U.S. PATENT DOCUMENTS

| | | |
|---|---|---|
| 6,852,584 B1 | 2/2005 | Chen et al. |
| 6,853,533 B2 | 2/2005 | Parkhe |
| 6,858,085 B1 | 2/2005 | Nguyen et al. |
| 6,858,112 B2 | 2/2005 | Flamm et al. |
| 6,858,153 B2 | 2/2005 | Bjorkman et al. |
| 6,858,523 B2 | 2/2005 | Jeffrey et al. |
| 6,861,097 B1 | 3/2005 | Goosey et al. |
| 6,861,332 B2 | 3/2005 | Park et al. |
| 6,867,086 B1 | 3/2005 | Chen et al. |
| 6,867,141 B2 | 3/2005 | Jung et al. |
| 6,869,880 B2 | 3/2005 | Krishnaraj et al. |
| 6,872,323 B1 | 3/2005 | Entley et al. |
| 6,872,909 B2 | 3/2005 | Holber et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,883,052 B2 | 4/2005 | Dorenbeck et al. |
| 6,883,733 B1 | 4/2005 | Lind |
| 6,884,685 B2 | 4/2005 | Luo et al. |
| 6,886,491 B2 | 5/2005 | Kim et al. |
| 6,890,403 B2 | 5/2005 | Cheung et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,067 B2 | 5/2005 | Kobayashi et al. |
| 6,900,596 B2 | 5/2005 | Yang et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,189 B2 | 8/2005 | Kwon et al. |
| 6,924,191 B2 | 8/2005 | Liu et al. |
| 6,930,047 B2 | 8/2005 | Yamazaki et al. |
| 6,935,269 B2 | 8/2005 | Lee et al. |
| 6,935,466 B2 | 8/2005 | Lubomirsky et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,955,836 B2 | 10/2005 | Kumagai et al. |
| 6,958,112 B2 | 10/2005 | Karim et al. |
| 6,958,175 B2 | 10/2005 | Sakamoto et al. |
| 6,958,286 B2 | 10/2005 | Chen et al. |
| 6,972,840 B1 | 12/2005 | Gu et al. |
| 6,974,523 B2 | 12/2005 | Benzing et al. |
| 6,974,780 B2 | 12/2005 | Schuegraf |
| 6,995,073 B2 | 2/2006 | Liou |
| 7,017,269 B2 | 3/2006 | White et al. |
| 7,017,514 B1 | 3/2006 | Shepherd, Jr. et al. |
| 7,018,902 B2 | 3/2006 | Visokay et al. |
| 7,018,941 B2 | 3/2006 | Cui et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,049,244 B2 | 5/2006 | Becker et al. |
| 7,052,553 B1 | 5/2006 | Shih et al. |
| 7,071,532 B2 | 7/2006 | Geffken et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,084,076 B2 | 8/2006 | Park et al. |
| 7,109,114 B2 | 9/2006 | Chen et al. |
| 7,115,419 B2 | 10/2006 | Suzuki |
| 7,115,525 B2 | 10/2006 | Abatchev et al. |
| 7,122,222 B2 | 10/2006 | Manchao et al. |
| 7,122,949 B2 | 10/2006 | Strikovski |
| 7,129,185 B2 | 10/2006 | Aoyama et al. |
| 7,138,767 B2 | 11/2006 | Chen et al. |
| 7,145,725 B2 | 12/2006 | Hasei et al. |
| 7,148,155 B1 | 12/2006 | Tarafdar et al. |
| 7,153,779 B2 | 12/2006 | Trapp |
| 7,166,233 B2 | 1/2007 | Johnson et al. |
| 7,176,144 B1 | 2/2007 | Wang et al. |
| 7,183,177 B2 | 2/2007 | Al-bayati et al. |
| 7,183,214 B2 | 2/2007 | Nam et al. |
| 7,192,626 B2 | 3/2007 | Dussarrat et al. |
| 7,196,342 B2 | 3/2007 | Ershov et al. |
| 7,205,240 B2 | 4/2007 | Karim et al. |
| 7,205,248 B2 | 4/2007 | Li et al. |
| 7,220,461 B2 | 5/2007 | Hasebe et al. |
| 7,223,701 B2 | 5/2007 | Min et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,255,773 B2 | 8/2007 | Ogasawara et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,608 B1 | 11/2007 | Papasouliotis et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,335,609 B2 | 2/2008 | Ingle et al. |
| 7,341,633 B2 | 3/2008 | Lubomirsky et al. |
| 7,344,912 B1 | 3/2008 | Okoronyanwu |
| 7,358,192 B2 | 4/2008 | Merry et al. |
| 7,361,865 B2 | 4/2008 | Maki et al. |
| 7,364,956 B2 | 4/2008 | Saito et al. |
| 7,365,016 B2 | 4/2008 | Ouellet et al. |
| 7,390,710 B2 | 6/2008 | Derderian et al. |
| 7,396,480 B2 | 7/2008 | Kao et al. |
| 7,396,773 B1 | 7/2008 | Blosse et al. |
| 7,399,388 B2 | 7/2008 | Moghadam et al. |
| 7,416,989 B1 | 8/2008 | Liu et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,210 B2 | 1/2009 | Mullapudi et al. |
| 7,479,303 B2 | 1/2009 | Byun |
| 7,484,473 B2 | 2/2009 | Keller et al. |
| 7,488,688 B2 | 2/2009 | Chung et al. |
| 7,494,545 B2 | 2/2009 | Lam et al. |
| 7,498,273 B2 | 3/2009 | Mallick et al. |
| 7,500,445 B2 | 3/2009 | Zhao et al. |
| 7,504,040 B2 | 3/2009 | Iijima et al. |
| 7,513,214 B2 | 4/2009 | Okumura et al. |
| 7,520,957 B2 | 4/2009 | Kao et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,543,546 B2 | 6/2009 | Shibata et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells et al. |
| 7,628,897 B2 | 12/2009 | Mungekar et al. |
| 7,655,571 B2 | 2/2010 | Kawaguchi et al. |
| 7,658,799 B2 | 2/2010 | Ishikawa |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,709,396 B2 | 5/2010 | Bencher et al. |
| 7,722,925 B2 | 5/2010 | White et al. |
| 7,723,221 B2 | 5/2010 | Hayashi |
| 7,745,352 B2 | 6/2010 | Mallick et al. |
| 7,749,326 B2 | 7/2010 | Kim et al. |
| 7,785,672 B2 | 8/2010 | Choi et al. |
| 7,790,634 B2 | 9/2010 | Munro et al. |
| 7,803,722 B2 | 9/2010 | Liang |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,825,044 B2 | 11/2010 | Mallick et al. |

(56) References Cited

U.S. PATENT DOCUMENTS

| | | |
|---|---|---|
| 7,837,828 B2 | 11/2010 | Ikeda et al. |
| 7,845,309 B2 | 12/2010 | Condrashoff et al. |
| 7,867,923 B2 | 1/2011 | Mallick et al. |
| 7,867,926 B2 | 1/2011 | Satoh et al. |
| 7,871,926 B2 | 1/2011 | Xia et al. |
| 7,902,080 B2 | 3/2011 | Chen et al. |
| 7,906,818 B2 | 3/2011 | Pekny |
| 7,910,491 B2 | 3/2011 | Kwon et al. |
| 7,915,139 B1 | 3/2011 | Lang et al. |
| 7,922,863 B2 | 4/2011 | Ripley et al. |
| 7,932,181 B2 | 4/2011 | Singh et al. |
| 7,935,643 B2 | 5/2011 | Liang et al. |
| 7,939,422 B2 | 5/2011 | Ingle et al. |
| 7,943,531 B2 | 5/2011 | Nemani et al. |
| 7,964,040 B2 | 6/2011 | Rasheed et al. |
| 7,968,441 B2 | 6/2011 | Xu |
| 7,976,631 B2 | 7/2011 | Burrows et al. |
| 7,977,249 B1 | 7/2011 | Liu et al. |
| 7,981,806 B2 | 7/2011 | Jung |
| 7,989,365 B2 | 8/2011 | Park et al. |
| 7,994,019 B1 | 8/2011 | Kweskin et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 5/2012 | Panagopoulos |
| 8,173,228 B2 | 5/2012 | Choi et al. |
| 8,183,134 B2 | 5/2012 | Wu et al. |
| 8,187,486 B1 | 5/2012 | Liu et al. |
| 8,199,454 B2 | 6/2012 | Koyama et al. |
| 8,202,441 B2 | 6/2012 | Chandrachood et al. |
| 8,211,808 B2 | 7/2012 | Sapre et al. |
| 8,216,486 B2 | 7/2012 | Dhindsa et al. |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen et al. |
| 8,343,306 B2 | 1/2013 | Tanaka et al. |
| 8,357,435 B2 | 1/2013 | Lubomirsky et al. |
| 8,361,892 B2 | 1/2013 | Tam et al. |
| 8,368,308 B2 | 2/2013 | Banna et al. |
| 8,390,980 B2 | 3/2013 | Sansoni et al. |
| 8,398,777 B2 | 3/2013 | Collins et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 7/2013 | Tang et al. |
| 8,506,713 B2 | 8/2013 | Takagi |
| 8,512,509 B2 | 8/2013 | Bera et al. |
| 8,528,889 B2 | 9/2013 | Nakano et al. |
| 8,540,844 B2 | 9/2013 | Hudson et al. |
| 8,541,312 B2 | 9/2013 | Wang et al. |
| 8,551,891 B2 | 10/2013 | Liang et al. |
| 8,573,152 B2 | 11/2013 | de la Llera et al. |
| 8,622,021 B2 | 1/2014 | Taylor et al. |
| 8,623,148 B2 | 1/2014 | Mitchell et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,721,798 B2 | 5/2014 | Cruse et al. |
| 8,741,778 B2 | 6/2014 | Yang et al. |
| 8,747,610 B2 | 6/2014 | Chen et al. |
| 8,747,680 B1 | 6/2014 | Deshpande et al. |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa et al. |
| 8,871,651 B1 | 10/2014 | Choi et al. |
| 8,888,087 B2 | 11/2014 | Okabe et al. |
| 8,894,767 B2 | 11/2014 | Chuc et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,937,017 B2 | 1/2015 | Cheshire et al. |
| 8,940,642 B2 | 1/2015 | Nemani et al. |
| 9,017,481 B1 | 1/2015 | Pettinger et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstroem et al. |
| 8,999,821 B2 | 4/2015 | Brand et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,023,732 B2 | 5/2015 | Wang et al. |
| 9,023,734 B2 | 5/2015 | Chen et al. |
| 9,034,770 B2 | 5/2015 | Park et al. |
| 9,039,911 B2 | 5/2015 | Hudson et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2 | 6/2015 | Lubomirsky et al. |
| 9,072,158 B2 | 6/2015 | Ikeda et al. |
| 9,093,371 B2 | 7/2015 | Wang et al. |
| 9,093,389 B2 | 7/2015 | Nemani et al. |
| 9,093,390 B2 | 7/2015 | Wang et al. |
| 9,099,398 B2 | 8/2015 | Kang et al. |
| 9,111,877 B2 | 8/2015 | Chen et al. |
| 9,111,907 B2 | 8/2015 | Kamineni et al. |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni et al. |

(56) References Cited

U.S. PATENT DOCUMENTS

| | | |
|---|---|---|
| 9,202,708 B1 | 12/2015 | Chen et al. |
| 9,209,012 B2 | 12/2015 | Chen et al. |
| 9,230,819 B2 | 1/2016 | Sun et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,267,739 B2 | 2/2016 | Chen et al. |
| 9,269,590 B2 | 2/2016 | Luere et al. |
| 9,275,834 B1 | 3/2016 | Park et al. |
| 9,275,887 B2 | 3/2016 | Willwerth et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,539 B2 | 3/2016 | Makhratchev et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,343,358 B2 | 5/2016 | Xu |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry, III et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,437,451 B2 | 9/2016 | Chen et al. |
| 9,443,749 B2 | 9/2016 | Wakabayashi et al. |
| 9,449,795 B2 | 9/2016 | Sabri et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja et al. |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore, Jr. et al. |
| 9,520,303 B2 | 12/2016 | Wang et al. |
| 9,528,183 B2 | 12/2016 | Wu et al. |
| 9,534,724 B2 | 1/2017 | Jiang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,809 B2 | 2/2017 | Korolik et al. |
| 9,576,815 B2 | 2/2017 | Xu et al. |
| 9,583,399 B1 | 2/2017 | Chen et al. |
| 9,601,319 B1 | 3/2017 | Bravo et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval |
| 9,691,645 B2 | 6/2017 | Benjaminson et al. |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,941,097 B2 | 4/2018 | Yamazawa et al. |
| 9,947,549 B1 | 4/2018 | Wang et al. |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,083,830 B2 | 9/2018 | Seino et al. |
| 10,121,689 B2 | 11/2018 | Konkola et al. |
| 10,147,620 B2 | 12/2018 | Benjaminson et al. |
| 10,147,736 B2 | 12/2018 | Tinuma |
| 10,217,614 B2 | 2/2019 | Tucker et al. |
| 10,256,079 B2 | 4/2019 | Lubomirsky et al. |
| 10,269,541 B2 | 4/2019 | Stowell et al. |
| 10,319,600 B1 | 6/2019 | Li et al. |
| 10,319,739 B2 | 6/2019 | Purayath |
| 10,354,843 B2 | 7/2019 | Liang et al. |
| 10,465,294 B2 | 11/2019 | Wang et al. |
| 10,619,245 B2 | 4/2020 | Tucker et al. |
| 10,622,189 B2 | 4/2020 | Bravo et al. |
| 10,679,870 B2 | 6/2020 | Samir et al. |
| 10,699,921 B2 | 6/2020 | Samir et al. |
| 2001/0000202 A1 | 4/2001 | Tibbitts et al. |
| 2001/0003014 A1 | 6/2001 | Yuda |
| 2001/0006070 A1 | 7/2001 | Shang et al. |
| 2001/0006093 A1 | 7/2001 | Tabuchi et al. |
| 2001/0008803 A1 | 7/2001 | Takamatsu et al. |
| 2001/0015261 A1 | 8/2001 | Kobayashi et al. |
| 2001/0021595 A1 | 9/2001 | Jang et al. |
| 2001/0023741 A1 | 9/2001 | Collison et al. |
| 2001/0024691 A1 | 9/2001 | Kimura et al. |
| 2001/0028093 A1 | 10/2001 | Yamazaki et al. |
| 2001/0028922 A1 | 10/2001 | Sandhu |
| 2001/0029112 A1 | 10/2001 | Toyoda et al. |
| 2001/0029114 A1 | 10/2001 | Vulpio et al. |
| 2001/0029891 A1 | 10/2001 | Oh et al. |
| 2001/0029892 A1 | 10/2001 | Cook et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0035127 A1 | 11/2001 | Metzner et al. |
| 2001/0036706 A1 | 11/2001 | Kitamura |
| 2001/0037856 A1 | 11/2001 | Park |

(56) References Cited

U.S. PATENT DOCUMENTS

| | | |
|---|---|---|
| 2001/0037941 A1 | 11/2001 | Thompson |
| 2001/0038919 A1 | 11/2001 | Berry et al. |
| 2001/0039921 A1 | 11/2001 | Rolfson et al. |
| 2001/0040099 A1 | 11/2001 | Pedersen et al. |
| 2001/0041444 A1 | 11/2001 | Shields et al. |
| 2001/0042511 A1 | 11/2001 | Liu et al. |
| 2001/0042512 A1 | 11/2001 | Xu et al. |
| 2001/0042799 A1 | 11/2001 | Kim et al. |
| 2001/0047760 A1 | 12/2001 | Moslehi |
| 2001/0053585 A1 | 12/2001 | Kikuchi et al. |
| 2001/0053610 A1 | 12/2001 | Athavale et al. |
| 2001/0054381 A1 | 12/2001 | Umotoy et al. |
| 2001/0054387 A1 | 12/2001 | Frankel et al. |
| 2001/0055842 A1 | 12/2001 | Uh et al. |
| 2002/0000202 A1 | 1/2002 | Yuda et al. |
| 2002/0001778 A1 | 1/2002 | Latchford et al. |
| 2002/0007912 A1 | 1/2002 | Kamarehi et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0015791 A1 | 2/2002 | Tobe et al. |
| 2002/0016080 A1 | 2/2002 | Khan et al. |
| 2002/0016085 A1 | 2/2002 | Huang et al. |
| 2002/0016489 A1 | 2/2002 | Marcuccio et al. |
| 2002/0017243 A1 | 2/2002 | Pyo |
| 2002/0023899 A1 | 2/2002 | Khater et al. |
| 2002/0023900 A1 | 2/2002 | Mahawili et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0037635 A1 | 3/2002 | Li et al. |
| 2002/0038791 A1 | 4/2002 | Okumura et al. |
| 2002/0040764 A1 | 4/2002 | Kwan et al. |
| 2002/0040766 A1 | 4/2002 | Takahashi et al. |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0048969 A1 | 4/2002 | Suzuki et al. |
| 2002/0050246 A1* | 5/2002 | Parkhe ............... H01L 21/67109 118/500 |
| 2002/0053585 A1 | 5/2002 | Rossi |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0075972 A1 | 6/2002 | Richards et al. |
| 2002/0081817 A1 | 6/2002 | Bhakta et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell et al. |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0127350 A1 | 9/2002 | Ishikawa et al. |
| 2002/0129769 A1 | 9/2002 | Kim et al. |
| 2002/0129902 A1 | 9/2002 | Babayan et al. |
| 2002/0139307 A1 | 10/2002 | Ryding et al. |
| 2002/0142530 A1 | 10/2002 | Hu et al. |
| 2002/0142585 A1 | 10/2002 | Mandai |
| 2002/0144657 A1 | 10/2002 | Chiang et al. |
| 2002/0146879 A1 | 10/2002 | Fu et al. |
| 2002/0153808 A1 | 10/2002 | Skotnicki et al. |
| 2002/0163637 A1 | 11/2002 | Rossman et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky |
| 2002/0182878 A1 | 12/2002 | Hirose et al. |
| 2002/0185067 A1 | 12/2002 | Upham |
| 2002/0187280 A1 | 12/2002 | Johnson et al. |
| 2002/0187655 A1 | 12/2002 | Tan et al. |
| 2002/0189760 A1 | 12/2002 | Park |
| 2002/0197823 A1 | 12/2002 | Yoo et al. |
| 2003/0000473 A1 | 1/2003 | Chae et al. |
| 2003/0003757 A1 | 1/2003 | Nallan et al. |
| 2003/0007910 A1 | 1/2003 | Diamant Lazarovich et al. |
| 2003/0010452 A1 | 1/2003 | Park et al. |
| 2003/0010645 A1 | 1/2003 | Ting et al. |
| 2003/0015515 A1 | 1/2003 | Ito et al. |
| 2003/0015764 A1 | 1/2003 | Raaijmakers et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0040199 A1 | 2/2003 | Agarwal |
| 2003/0054608 A1 | 3/2003 | Tseng et al. |
| 2003/0064154 A1 | 4/2003 | Laxman et al. |
| 2003/0066482 A1 | 4/2003 | Pokharna et al. |
| 2003/0066607 A1 | 4/2003 | White et al. |
| 2003/0070761 A1 | 4/2003 | Turlot et al. |
| 2003/0071035 A1 | 4/2003 | Brailove |
| 2003/0072639 A1 | 4/2003 | White et al. |
| 2003/0073310 A1 | 4/2003 | Olgado et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink et al. |
| 2003/0087531 A1 | 5/2003 | Kang et al. |
| 2003/0091938 A1 | 5/2003 | Fairbairn et al. |
| 2003/0094134 A1 | 5/2003 | Minami |
| 2003/0094773 A1 | 5/2003 | Lerner et al. |
| 2003/0098125 A1 | 5/2003 | An |
| 2003/0107109 A1 | 6/2003 | Curro et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0118731 A1 | 6/2003 | He et al. |
| 2003/0118748 A1 | 6/2003 | Kumagai et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0124873 A1 | 7/2003 | Xing et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0143841 A1 | 7/2003 | Yang et al. |
| 2003/0148035 A1 | 8/2003 | Lingampalli |
| 2003/0150530 A1 | 8/2003 | Lin et al. |
| 2003/0152691 A1 | 8/2003 | Baude et al. |
| 2003/0159307 A1 | 8/2003 | Sago et al. |
| 2003/0159656 A1 | 8/2003 | Tan et al. |
| 2003/0164226 A1* | 9/2003 | Kanno ............... H01L 21/67109 438/758 |
| 2003/0168439 A1 | 9/2003 | Kanno et al. |
| 2003/0170945 A1 | 9/2003 | Igeta et al. |
| 2003/0172872 A1 | 9/2003 | Thakur et al. |
| 2003/0173333 A1 | 9/2003 | Wang et al. |
| 2003/0173347 A1 | 9/2003 | Guiver |
| 2003/0173675 A1 | 9/2003 | Watanabe et al. |
| 2003/0181040 A1 | 9/2003 | Ivanov et al. |

(56) References Cited

U.S. PATENT DOCUMENTS

| | | |
|---|---|---|
| 2003/0183244 A1 | 10/2003 | Rossman |
| 2003/0190426 A1 | 10/2003 | Padhi et al. |
| 2003/0196757 A1 | 10/2003 | Todorow et al. |
| 2003/0196760 A1 | 10/2003 | Tyler et al. |
| 2003/0199151 A1 | 10/2003 | Ho et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0205479 A1 | 11/2003 | Lin et al. |
| 2003/0209323 A1 | 11/2003 | Yokogaki |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0217810 A1 | 11/2003 | Chen et al. |
| 2003/0217812 A1 | 11/2003 | Yoshiki et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2003/0232495 A1 | 12/2003 | Moghadam et al. |
| 2004/0002221 A1 | 1/2004 | O'Donnell et al. |
| 2004/0004892 A1 | 1/2004 | Kaiser et al. |
| 2004/0005726 A1 | 1/2004 | Huang |
| 2004/0008334 A1 | 1/2004 | Sreenivasa et al. |
| 2004/0018304 A1 | 1/2004 | Chung et al. |
| 2004/0020601 A1 | 2/2004 | Zhao et al. |
| 2004/0020801 A1 | 2/2004 | Solling |
| 2004/0025788 A1 | 2/2004 | Ogasawara et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0035364 A1 | 2/2004 | Tomoyoshi et al. |
| 2004/0048492 A1 | 3/2004 | Ishikawa et al. |
| 2004/0050328 A1 | 3/2004 | Kumagai et al. |
| 2004/0050492 A1 | 3/2004 | Tsuei et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0065253 A1 | 4/2004 | Tois et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0079118 A1 | 4/2004 | M'Saad et al. |
| 2004/0083962 A1 | 5/2004 | Bang et al. |
| 2004/0083967 A1 | 5/2004 | Yuda et al. |
| 2004/0084150 A1 | 5/2004 | George et al. |
| 2004/0087139 A1 | 5/2004 | Yeh et al. |
| 2004/0092063 A1 | 5/2004 | Okumura et al. |
| 2004/0094091 A1 | 5/2004 | Yang et al. |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0110354 A1 | 6/2004 | Natzle et al. |
| 2004/0115876 A1 | 6/2004 | Goundar et al. |
| 2004/0115947 A1* | 6/2004 | Fink ................ H01L 21/67103 438/716 |
| 2004/0118519 A1 | 6/2004 | Sen et al. |
| 2004/0123800 A1 | 7/2004 | Schlottmann |
| 2004/0124280 A1 | 7/2004 | Shih et al. |
| 2004/0129224 A1 | 7/2004 | Yamazaki |
| 2004/0129671 A1 | 7/2004 | Ji et al. |
| 2004/0134773 A1 | 7/2004 | Pedersen et al. |
| 2004/0137161 A1 | 7/2004 | Segawa et al. |
| 2004/0137749 A1 | 7/2004 | Mng et al. |
| 2004/0139983 A1 | 7/2004 | Lakshmanan et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0146661 A1 | 7/2004 | Kapoor et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0149699 A1 | 8/2004 | Hofman et al. |
| 2004/0152342 A1 | 8/2004 | Li et al. |
| 2004/0154535 A1 | 8/2004 | Chen et al. |
| 2004/0157444 A1 | 8/2004 | Chiu et al. |
| 2004/0159343 A1 | 8/2004 | Shimbara et al. |
| 2004/0161899 A1 | 8/2004 | Luo et al. |
| 2004/0161921 A1 | 8/2004 | Ryu |
| 2004/0163590 A1 | 8/2004 | Tran et al. |
| 2004/0163594 A1 | 8/2004 | Windhorn |
| 2004/0163601 A1 | 8/2004 | Kadotani et al. |
| 2004/0175501 A1 | 9/2004 | Lukas et al. |
| 2004/0175913 A1 | 9/2004 | Johnson et al. |
| 2004/0175929 A1 | 9/2004 | Schmitt et al. |
| 2004/0180557 A1 | 9/2004 | Park et al. |
| 2004/0182315 A1 | 9/2004 | Laflamme, Jr. et al. |
| 2004/0185641 A1 | 9/2004 | Tanabe et al. |
| 2004/0187787 A1 | 9/2004 | Dawson et al. |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey et al. |
| 2004/0201843 A1 | 10/2004 | Glenn et al. |
| 2004/0203247 A1 | 10/2004 | Wu et al. |
| 2004/0206305 A1 | 10/2004 | Choi et al. |
| 2004/0206730 A1 | 10/2004 | Holber et al. |
| 2004/0211357 A1 | 10/2004 | Gadgil et al. |
| 2004/0211664 A1 | 10/2004 | Wang |
| 2004/0216844 A1 | 11/2004 | Janakiraman et al. |
| 2004/0219723 A1 | 11/2004 | Peng et al. |
| 2004/0219737 A1 | 11/2004 | Quon |
| 2004/0219780 A1 | 11/2004 | Ohuchi |
| 2004/0219789 A1 | 11/2004 | Wood et al. |
| 2004/0221809 A1 | 11/2004 | Ohmi et al. |
| 2004/0231590 A1 | 11/2004 | Ovshinsky |
| 2004/0231706 A1 | 11/2004 | Bhatnagar et al. |
| 2004/0231799 A1 | 11/2004 | Lee et al. |
| 2004/0237897 A1 | 12/2004 | Hanawa et al. |
| 2004/0238123 A1 | 12/2004 | Becknell et al. |
| 2004/0241342 A1 | 12/2004 | Karim et al. |
| 2004/0245091 A1 | 12/2004 | Karim et al. |
| 2004/0248374 A1 | 12/2004 | Belyansky et al. |
| 2004/0248404 A1 | 12/2004 | Subrahmanyan et al. |
| 2004/0259367 A1 | 12/2004 | Constantine et al. |
| 2004/0261721 A1 | 12/2004 | Steger |
| 2004/0263827 A1 | 12/2004 | Xu et al. |
| 2005/0000430 A1 | 1/2005 | Jang et al. |
| 2005/0000432 A1 | 1/2005 | Keller et al. |
| 2005/0001276 A1 | 1/2005 | Gao et al. |
| 2005/0001556 A1 | 1/2005 | Hoffman et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0019494 A1 | 1/2005 | Moghadam et al. |
| 2005/0026430 A1 | 2/2005 | Kim et al. |
| 2005/0026431 A1 | 2/2005 | Kazumi et al. |
| 2005/0026443 A1 | 2/2005 | Goo et al. |
| 2005/0032388 A1 | 2/2005 | Donohoe |
| 2005/0035455 A1 | 2/2005 | Hu et al. |
| 2005/0039679 A1 | 2/2005 | Kleshock et al. |
| 2005/0048801 A1 | 3/2005 | Karim et al. |
| 2005/0050908 A1 | 3/2005 | Lee et al. |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0062165 A1 | 3/2005 | Saenger et al. |
| 2005/0073051 A1 | 4/2005 | Yamamoto et al. |
| 2005/0077284 A1 | 4/2005 | Natsuhara et al. |
| 2005/0077553 A1 | 4/2005 | Kim et al. |
| 2005/0079706 A1 | 4/2005 | Kumar et al. |
| 2005/0087140 A1 | 4/2005 | Yuda et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |

(56) References Cited

U.S. PATENT DOCUMENTS

| | | |
|---|---|---|
| 2005/0098265 A1 | 5/2005 | Fink et al. |
| 2005/0103267 A1 | 5/2005 | Hur et al. |
| 2005/0103440 A1 | 5/2005 | Sato et al. |
| 2005/0105991 A1 | 5/2005 | Hofmeister et al. |
| 2005/0109279 A1 | 5/2005 | Suzuki |
| 2005/0112876 A1 | 5/2005 | Wu et al. |
| 2005/0112901 A1 | 5/2005 | Ji et al. |
| 2005/0118794 A1 | 6/2005 | Babayan et al. |
| 2005/0121145 A1 | 6/2005 | Du Bois et al. |
| 2005/0121750 A1 | 6/2005 | Chan et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0139578 A1 | 6/2005 | Fukuda et al. |
| 2005/0142895 A1 | 6/2005 | Ingle et al. |
| 2005/0145173 A1 | 7/2005 | Holber et al. |
| 2005/0145341 A1 | 7/2005 | Suzuki |
| 2005/0153574 A1 | 7/2005 | Mandal et al. |
| 2005/0164479 A1 | 7/2005 | Perng et al. |
| 2005/0167052 A1 | 8/2005 | Ishihara et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0178748 A1 | 8/2005 | Buchberger, Jr. et al. |
| 2005/0181555 A1 | 8/2005 | Haukka et al. |
| 2005/0181588 A1 | 8/2005 | Kim |
| 2005/0183666 A1 | 8/2005 | Tsuji et al. |
| 2005/0183827 A1 | 8/2005 | White et al. |
| 2005/0186731 A1 | 8/2005 | Derderian et al. |
| 2005/0186789 A1 | 8/2005 | Agarwal |
| 2005/0194094 A1 | 9/2005 | Yasaka |
| 2005/0196533 A1 | 9/2005 | Hasebe et al. |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217578 A1 | 10/2005 | Gurary et al. |
| 2005/0217582 A1 | 10/2005 | Kim et al. |
| 2005/0218507 A1 | 10/2005 | Kao et al. |
| 2005/0219786 A1* | 10/2005 | Brown ............... H01L 21/6831 361/234 |
| 2005/0221552 A1 | 10/2005 | Kao et al. |
| 2005/0224181 A1 | 10/2005 | Merry et al. |
| 2005/0227499 A1 | 10/2005 | Park et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241763 A1 | 11/2005 | Huang et al. |
| 2005/0247672 A1 | 11/2005 | Tatsumi |
| 2005/0250340 A1 | 11/2005 | Chen et al. |
| 2005/0251990 A1 | 11/2005 | Choi et al. |
| 2005/0258160 A1 | 11/2005 | Goto et al. |
| 2005/0260347 A1 | 11/2005 | Narwankar et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0268856 A1 | 12/2005 | Miller et al. |
| 2005/0269030 A1 | 12/2005 | Kent et al. |
| 2005/0271812 A1 | 12/2005 | Myo et al. |
| 2005/0272191 A1 | 12/2005 | Shah et al. |
| 2005/0274324 A1 | 12/2005 | Takahashi et al. |
| 2005/0274396 A1 | 12/2005 | Shih et al. |
| 2005/0279454 A1 | 12/2005 | Snijders |
| 2005/0283321 A1 | 12/2005 | Yue et al. |
| 2005/0287755 A1 | 12/2005 | Bachmann et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1* | 1/2006 | Ikeda ............... H01L 21/6831 156/345.51 |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0011984 A1 | 1/2006 | Curie |
| 2006/0014399 A1 | 1/2006 | Joe |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019485 A1 | 1/2006 | Komai et al. |
| 2006/0019486 A1 | 1/2006 | Yu et al. |
| 2006/0020797 A1 | 1/2006 | Zhang et al. |
| 2006/0021574 A1 | 2/2006 | Armour et al. |
| 2006/0021701 A1 | 2/2006 | Tobe et al. |
| 2006/0021702 A1 | 2/2006 | Kumar et al. |
| 2006/0021703 A1 | 2/2006 | Umotoy et al. |
| 2006/0024517 A1 | 2/2006 | Doan et al. |
| 2006/0024954 A1 | 2/2006 | Wu et al. |
| 2006/0024956 A1 | 2/2006 | Zhijian et al. |
| 2006/0030151 A1 | 2/2006 | Ding et al. |
| 2006/0030165 A1 | 2/2006 | Ingle et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0042545 A1 | 3/2006 | Shibata et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell et al. |
| 2006/0046484 A1 | 3/2006 | Abatchev et al. |
| 2006/0046506 A1 | 3/2006 | Fukiage |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0055004 A1 | 3/2006 | Gates et al. |
| 2006/0057828 A1 | 3/2006 | Omura et al. |
| 2006/0060942 A1 | 3/2006 | Minixhofer et al. |
| 2006/0063332 A1 | 3/2006 | Doyle et al. |
| 2006/0065629 A1 | 3/2006 | Chen et al. |
| 2006/0068599 A1 | 3/2006 | Baek et al. |
| 2006/0073349 A1 | 4/2006 | Aihara et al. |
| 2006/0075966 A1 | 4/2006 | Chen et al. |
| 2006/0075967 A1 | 4/2006 | Lu et al. |
| 2006/0075969 A1 | 4/2006 | Fischer |
| 2006/0076108 A1 | 4/2006 | Holland et al. |
| 2006/0081337 A1 | 4/2006 | Himori et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0096540 A1 | 5/2006 | Choi |
| 2006/0097397 A1 | 5/2006 | Russell |
| 2006/0102076 A1 | 5/2006 | Smith et al. |
| 2006/0102587 A1 | 5/2006 | Kimura |
| 2006/0110943 A1 | 5/2006 | Swerts et al. |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121394 A1 | 6/2006 | Chi |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0137613 A1 | 6/2006 | Kasai |
| 2006/0151115 A1 | 7/2006 | Kim |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0178018 A1 | 8/2006 | Olsen |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |

(56) References Cited

U.S. PATENT DOCUMENTS

| | | |
|---|---|---|
| 2006/0210713 A1 | 9/2006 | Brcka |
| 2006/0210723 A1 | 9/2006 | Ishizaka |
| 2006/0211163 A1 | 9/2006 | Ouellet et al. |
| 2006/0211260 A1 | 9/2006 | Tran et al. |
| 2006/0215347 A1 | 9/2006 | Wakabayashi |
| 2006/0216878 A1 | 9/2006 | Lee |
| 2006/0216923 A1 | 9/2006 | Tran et al. |
| 2006/0219360 A1 | 10/2006 | Iwasaki |
| 2006/0222481 A1 | 10/2006 | Foree |
| 2006/0223315 A1 | 10/2006 | Yokota et al. |
| 2006/0223324 A1 | 10/2006 | Ikegami et al. |
| 2006/0225648 A1 | 10/2006 | Rasheed et al. |
| 2006/0226121 A1 | 10/2006 | Aoi |
| 2006/0228496 A1 | 10/2006 | Choi et al. |
| 2006/0228889 A1 | 10/2006 | Edelberg et al. |
| 2006/0228903 A1 | 10/2006 | McSwiney et al. |
| 2006/0236932 A1 | 10/2006 | Yokogawa et al. |
| 2006/0240661 A1 | 10/2006 | Annapragada et al. |
| 2006/0244107 A1 | 11/2006 | Sugihara et al. |
| 2006/0246217 A1 | 11/2006 | Weidman et al. |
| 2006/0246717 A1 | 11/2006 | Wang |
| 2006/0251499 A1 | 11/2006 | Lunday et al. |
| 2006/0251800 A1 | 11/2006 | Weidman et al. |
| 2006/0251801 A1 | 11/2006 | Weidman et al. |
| 2006/0252240 A1 | 11/2006 | Gschwandtner et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0263522 A1 | 11/2006 | Byun |
| 2006/0264003 A1 | 11/2006 | Eun |
| 2006/0264043 A1 | 11/2006 | Stewart et al. |
| 2006/0266288 A1 | 11/2006 | Choi |
| 2006/0281496 A1 | 12/2006 | Cedraeus et al. |
| 2006/0285270 A1 | 12/2006 | Lee |
| 2006/0286774 A1 | 12/2006 | Singh et al. |
| 2006/0286776 A1 | 12/2006 | Ranish et al. |
| 2006/0292846 A1 | 12/2006 | Pinto et al. |
| 2007/0020392 A1 | 1/2007 | Kobrin et al. |
| 2007/0022952 A1 | 2/2007 | Ritchie et al. |
| 2007/0022954 A1 | 2/2007 | Iizuka et al. |
| 2007/0023320 A1 | 2/2007 | Itakura et al. |
| 2007/0025907 A1 | 2/2007 | Rezeq et al. |
| 2007/0026689 A1 | 2/2007 | Nakata et al. |
| 2007/0031598 A1 | 2/2007 | Okuyama et al. |
| 2007/0032062 A1 | 2/2007 | Lee et al. |
| 2007/0039548 A1 | 2/2007 | Johnson |
| 2007/0048977 A1 | 3/2007 | Lee et al. |
| 2007/0049044 A1 | 3/2007 | Marsh |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0068625 A1 | 3/2007 | Funk et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi et al. |
| 2007/0077777 A1 | 4/2007 | Gumpher |
| 2007/0079758 A1 | 4/2007 | Holland et al. |
| 2007/0080057 A1 | 4/2007 | Mizohata et al. |
| 2007/0087949 A1 | 4/2007 | Wu et al. |
| 2007/0090325 A1 | 4/2007 | Hwang et al. |
| 2007/0092661 A1 | 4/2007 | Ryuzaki et al. |
| 2007/0096658 A1 | 5/2007 | Saigusa et al. |
| 2007/0099417 A1 | 5/2007 | Fang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0117397 A1 | 5/2007 | Fu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma et al. |
| 2007/0131274 A1 | 6/2007 | Stollwerck et al. |
| 2007/0134433 A1 | 6/2007 | Dussarrat et al. |
| 2007/0134938 A1 | 6/2007 | Kozuka et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0166892 A1 | 7/2007 | Hori |
| 2007/0169703 A1* | 7/2007 | Elliot .................. C23C 16/4586 156/914 |
| 2007/0173073 A1 | 7/2007 | Weber |
| 2007/0175861 A1 | 8/2007 | Hwang et al. |
| 2007/0181057 A1 | 8/2007 | Lam et al. |
| 2007/0181966 A1 | 8/2007 | Watatani et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0207590 A1 | 9/2007 | Kiyotoshi et al. |
| 2007/0209931 A1 | 9/2007 | Miller |
| 2007/0212288 A1 | 9/2007 | Holst et al. |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0232082 A1 | 10/2007 | Balseanu et al. |
| 2007/0235062 A1 | 10/2007 | Fujiwara et al. |
| 2007/0235134 A1 | 10/2007 | Iimuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu et al. |
| 2007/0266946 A1 | 11/2007 | Choi |
| 2007/0269976 A1 | 11/2007 | Futase et al. |
| 2007/0272154 A1 | 11/2007 | Amikura et al. |
| 2007/0275569 A1 | 11/2007 | Moghadam et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0281495 A1 | 12/2007 | Mallick et al. |
| 2007/0281496 A1 | 12/2007 | Ingle et al. |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0289534 A1 | 12/2007 | Lubomirsky et al. |
| 2007/0293043 A1 | 12/2007 | Singh et al. |
| 2007/0296967 A1 | 12/2007 | Gupta et al. |
| 2008/0000423 A1 | 1/2008 | Fukiage |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0026597 A1 | 1/2008 | Munro et al. |
| 2008/0029032 A1 | 2/2008 | Sun et al. |
| 2008/0035608 A1 | 2/2008 | Thomas et al. |
| 2008/0042283 A1 | 2/2008 | Purushothaman et al. |
| 2008/0044990 A1 | 2/2008 | Lee |
| 2008/0050538 A1 | 2/2008 | Hirata |
| 2008/0063798 A1 | 3/2008 | Kher et al. |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0085607 A1 | 4/2008 | Yu et al. |
| 2008/0089001 A1* | 4/2008 | Parkhe ................ H01L 21/6831 279/128 |
| 2008/0099147 A1 | 5/2008 | Myo et al. |
| 2008/0099426 A1 | 5/2008 | Kumar et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102203 A1 | 5/2008 | Wu et al. |
| 2008/0102223 A1 | 5/2008 | Wagner et al. |
| 2008/0102570 A1 | 5/2008 | Fischer et al. |

(56) References Cited

U.S. PATENT DOCUMENTS

| | | |
|---|---|---|
| 2008/0102640 A1 | 5/2008 | Hassan et al. |
| 2008/0102646 A1 | 5/2008 | Kawaguchi et al. |
| 2008/0102650 A1 | 5/2008 | Adams et al. |
| 2008/0104782 A1 | 5/2008 | Hughes |
| 2008/0105555 A1 | 5/2008 | Iwazaki |
| 2008/0115726 A1 | 5/2008 | Ingle et al. |
| 2008/0121970 A1 | 5/2008 | Aritome |
| 2008/0124919 A1 | 5/2008 | Huang et al. |
| 2008/0124937 A1 | 5/2008 | Xu et al. |
| 2008/0141941 A1 | 6/2008 | Augustino et al. |
| 2008/0142483 A1 | 6/2008 | Hua et al. |
| 2008/0142831 A1 | 6/2008 | Su |
| 2008/0149596 A1 | 6/2008 | Dhindsa et al. |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0162781 A1 | 7/2008 | Haller et al. |
| 2008/0166861 A1 | 7/2008 | Mizuno et al. |
| 2008/0169588 A1 | 7/2008 | Shih et al. |
| 2008/0171407 A1 | 7/2008 | Nakabayashi et al. |
| 2008/0173906 A1 | 7/2008 | Zhu et al. |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0188087 A1 | 8/2008 | Chen et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0206934 A1 | 8/2008 | Jones et al. |
| 2008/0206954 A1 | 8/2008 | Choi et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236748 A1 | 10/2008 | Kobayashi et al. |
| 2008/0236751 A1 | 10/2008 | Aramaki et al. |
| 2008/0254635 A1 | 10/2008 | Benzel et al. |
| 2008/0260969 A1 | 10/2008 | Dussarrat et al. |
| 2008/0261404 A1 | 10/2008 | Kozuka et al. |
| 2008/0264337 A1 | 10/2008 | Sano et al. |
| 2008/0268171 A1 | 10/2008 | Ma et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0311032 A1 | 12/2008 | Sun et al. |
| 2008/0317965 A1 | 12/2008 | Son et al. |
| 2008/0318429 A1 | 12/2008 | Ozawa et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang et al. |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0031953 A1 | 2/2009 | Ingle et al. |
| 2009/0034148 A1 | 2/2009 | Lubomirsky et al. |
| 2009/0035917 A1 | 2/2009 | Ahn et al. |
| 2009/0036292 A1 | 2/2009 | Sun et al. |
| 2009/0045167 A1 | 2/2009 | Maruyama |
| 2009/0047793 A1 | 2/2009 | Fukasawa |
| 2009/0053901 A1 | 2/2009 | Goto et al. |
| 2009/0061640 A1 | 3/2009 | Wong et al. |
| 2009/0061647 A1 | 3/2009 | Mallick et al. |
| 2009/0065480 A1 | 3/2009 | Ohmi et al. |
| 2009/0072401 A1 | 3/2009 | Arnold et al. |
| 2009/0075409 A1 | 3/2009 | Ueno et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram et al. |
| 2009/0095221 A1 | 4/2009 | Tam et al. |
| 2009/0095621 A1 | 4/2009 | Kao et al. |
| 2009/0098276 A1 | 4/2009 | Burrows et al. |
| 2009/0098706 A1 | 4/2009 | Kim et al. |
| 2009/0104738 A1 | 4/2009 | Ring et al. |
| 2009/0104755 A1 | 4/2009 | Mallick et al. |
| 2009/0104764 A1 | 4/2009 | Xia et al. |
| 2009/0104782 A1 | 4/2009 | Lu et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0107403 A1 | 4/2009 | Moshtagh et al. |
| 2009/0111280 A1 | 4/2009 | Kao et al. |
| 2009/0117270 A1 | 5/2009 | Yamasaki et al. |
| 2009/0120368 A1 | 5/2009 | Lubomirsky et al. |
| 2009/0120464 A1 | 5/2009 | Rasheed et al. |
| 2009/0120582 A1 | 5/2009 | Koshimizu et al. |
| 2009/0120584 A1 | 5/2009 | Lubomirsky et al. |
| 2009/0159213 A1 | 6/2009 | Bera et al. |
| 2009/0159588 A1 | 6/2009 | Morioka et al. |
| 2009/0162647 A1 | 6/2009 | Sun et al. |
| 2009/0169744 A1 | 7/2009 | Byun et al. |
| 2009/0170221 A1 | 7/2009 | Jacques et al. |
| 2009/0170331 A1 | 7/2009 | Cheng et al. |
| 2009/0178764 A1 | 7/2009 | Kanno et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0191714 A1 | 7/2009 | Lai et al. |
| 2009/0194233 A1 | 8/2009 | Tamura et al. |
| 2009/0194508 A1 | 8/2009 | Ui et al. |
| 2009/0194810 A1 | 8/2009 | Kiyotoshi et al. |
| 2009/0197418 A1 | 8/2009 | Sago et al. |
| 2009/0202721 A1 | 8/2009 | Nogami et al. |
| 2009/0203225 A1 | 8/2009 | Gates et al. |
| 2009/0212804 A1 | 8/2009 | Yamada et al. |
| 2009/0214825 A1 | 8/2009 | Sun et al. |
| 2009/0218043 A1 | 9/2009 | Balakrishna et al. |
| 2009/0218317 A1 | 9/2009 | Belen et al. |
| 2009/0221137 A1 | 9/2009 | Matsui et al. |
| 2009/0223928 A1 | 9/2009 | Colpo et al. |
| 2009/0226633 A1 | 9/2009 | LaFlamme, Jr. et al. |
| 2009/0230636 A1 | 9/2009 | Goto |
| 2009/0236041 A1 | 9/2009 | Iizuka |
| 2009/0236043 A1 | 9/2009 | Matsudo et al. |
| 2009/0236314 A1 | 9/2009 | Chen |
| 2009/0236547 A1 | 9/2009 | Huang et al. |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0291027 A1 | 11/2009 | Choi |
| 2009/0293809 A1* | 12/2009 | Cho ............... H01L 21/68785 |
| | | 118/725 |
| 2009/0294898 A1 | 12/2009 | Feustel et al. |
| 2009/0298256 A1 | 12/2009 | Chen et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2009/0325391 A1 | 12/2009 | De Vusser et al. |
| 2010/0000683 A1 | 1/2010 | Kadkhodayan et al. |
| 2010/0003406 A1 | 1/2010 | Lam et al. |
| 2010/0003824 A1 | 1/2010 | Kadkhodayan et al. |
| 2010/0018648 A1* | 1/2010 | Collins ............... H01L 21/6833 |
| | | 156/345.24 |

(56) References Cited

U.S. PATENT DOCUMENTS

| | | |
|---|---|---|
| 2010/0022030 A1 | 1/2010 | Ditizio |
| 2010/0025370 A1 | 2/2010 | Dieguez-Campo et al. |
| 2010/0029088 A1 | 2/2010 | Mayer et al. |
| 2010/0037821 A1 | 2/2010 | Nogami |
| 2010/0039747 A1 | 2/2010 | Sansoni et al. |
| 2010/0043726 A1 | 2/2010 | Kosanke |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0055921 A1 | 3/2010 | Mitchell et al. |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher et al. |
| 2010/0081285 A1 | 4/2010 | Chen et al. |
| 2010/0087038 A1 | 4/2010 | Chung et al. |
| 2010/0089533 A1 | 4/2010 | Ueda et al. |
| 2010/0092803 A1 | 4/2010 | Yuasa et al. |
| 2010/0093151 A1 | 4/2010 | Arghavani et al. |
| 2010/0093168 A1 | 4/2010 | Naik |
| 2010/0093187 A1 | 4/2010 | Lee et al. |
| 2010/0095891 A1 | 4/2010 | Zhao et al. |
| 2010/0096367 A1 | 4/2010 | Jeon et al. |
| 2010/0098882 A1 | 4/2010 | Lubomirsky et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0109161 A1 | 5/2010 | Schuehrer et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0129982 A1 | 5/2010 | Kao et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0154835 A1 | 6/2010 | Dimeo et al. |
| 2010/0159703 A1 | 6/2010 | Fischer et al. |
| 2010/0164422 A1 | 7/2010 | Shu et al. |
| 2010/0167461 A1 | 7/2010 | Rana et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura et al. |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0213172 A1 | 8/2010 | Wilson |
| 2010/0221895 A1 | 9/2010 | Seino et al. |
| 2010/0221925 A1 | 9/2010 | Lee |
| 2010/0224322 A1 | 9/2010 | Sui et al. |
| 2010/0224324 A1 | 9/2010 | Kasai |
| 2010/0230052 A1 | 9/2010 | Iizuka et al. |
| 2010/0240205 A1 | 9/2010 | Son et al. |
| 2010/0243165 A1 | 9/2010 | Um |
| 2010/0243606 A1 | 9/2010 | Koshimizu et al. |
| 2010/0244204 A1 | 9/2010 | Matsuoka et al. |
| 2010/0244350 A1 | 9/2010 | Fujisato et al. |
| 2010/0248488 A1 | 9/2010 | Agarwal et al. |
| 2010/0252068 A1 | 10/2010 | Kannan et al. |
| 2010/0255667 A1 | 10/2010 | Seino et al. |
| 2010/0258913 A1 | 10/2010 | Lue |
| 2010/0263588 A1 | 10/2010 | Zhiyin |
| 2010/0267224 A1 | 10/2010 | Choi et al. |
| 2010/0267248 A1 | 10/2010 | Ma et al. |
| 2010/0272895 A1 | 10/2010 | Tsuda |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0317197 A1 | 12/2010 | Lind et al. |
| 2010/0317198 A1 | 12/2010 | Antonelli et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0011341 A1 | 1/2011 | Nishimoto |
| 2011/0011730 A1 | 1/2011 | Valcore, Jr. et al. |
| 2011/0014798 A1 | 1/2011 | Mallick et al. |
| 2011/0034025 A1 | 2/2011 | Nie et al. |
| 2011/0034035 A1 | 2/2011 | Liang et al. |
| 2011/0034039 A1 | 2/2011 | Liang et al. |
| 2011/0039407 A1 | 2/2011 | Nishizuka et al. |
| 2011/0042799 A1 | 2/2011 | Kang et al. |
| 2011/0043228 A1 | 2/2011 | Makhratchev et al. |
| 2011/0045676 A1 | 2/2011 | Park et al. |
| 2011/0048325 A1 | 3/2011 | Choi et al. |
| 2011/0048515 A1 | 3/2011 | Englert et al. |
| 2011/0049102 A1 | 3/2011 | Kroll et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito et al. |
| 2011/0101335 A1 | 5/2011 | Yamazaki et al. |
| 2011/0104393 A1 | 5/2011 | Hilkene et al. |
| 2011/0111137 A1 | 5/2011 | Liang et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0126764 A1 | 6/2011 | Sun et al. |
| 2011/0127156 A1 | 6/2011 | Foad et al. |
| 2011/0129616 A1 | 6/2011 | Ingle et al. |
| 2011/0133650 A1 | 6/2011 | Kim |
| 2011/0136347 A1 | 6/2011 | Kovarsky et al. |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shih et al. |
| 2011/0147363 A1* | 6/2011 | Yap ............... H01L 21/68792 |
| | | 219/385 |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159213 A1 | 6/2011 | Cai et al. |
| 2011/0159690 A1 | 6/2011 | Chandrashekar et al. |
| 2011/0159703 A1 | 6/2011 | Liang et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0165781 A1 | 7/2011 | Liang et al. |
| 2011/0174778 A1 | 7/2011 | Sawada et al. |
| 2011/0180847 A1 | 7/2011 | Ikeda et al. |
| 2011/0189860 A1 | 8/2011 | Porshnev et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0206591 A1 | 8/2011 | Laine et al. |
| 2011/0207332 A1 | 8/2011 | Liu et al. |
| 2011/0217851 A1 | 9/2011 | Liang et al. |
| 2011/0223752 A1 | 9/2011 | Hing et al. |
| 2011/0223774 A1 | 9/2011 | Kweskin et al. |
| 2011/0226734 A1 | 9/2011 | Sumiya et al. |
| 2011/0227028 A1 | 9/2011 | Sekar et al. |

(56) References Cited

U.S. PATENT DOCUMENTS

| | | |
|---|---|---|
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0253044 A1 | 10/2011 | Tam et al. |
| 2011/0256315 A1 | 10/2011 | Tam et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu et al. |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0290419 A1 | 12/2011 | Horiguchi et al. |
| 2011/0294300 A1 | 12/2011 | Zhang et al. |
| 2011/0298061 A1 | 12/2011 | Siddiqui et al. |
| 2011/0298098 A1 | 12/2011 | Chang |
| 2011/0303146 A1 | 12/2011 | Nishijima et al. |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0012848 A1 | 1/2012 | Suh |
| 2012/0017989 A1 | 1/2012 | Chang et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao |
| 2012/0073501 A1 | 3/2012 | Lubomirsky et al. |
| 2012/0083133 A1 | 4/2012 | Solis et al. |
| 2012/0088356 A1 | 4/2012 | Santhanam et al. |
| 2012/0091108 A1 | 4/2012 | Lin et al. |
| 2012/0094468 A1 | 4/2012 | Bhatia et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto et al. |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0142192 A1 | 6/2012 | Li et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0190178 A1 | 7/2012 | Wang et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0208369 A1 | 8/2012 | Nishizuka et al. |
| 2012/0211462 A1 | 8/2012 | Zhang et al. |
| 2012/0211722 A1 | 8/2012 | Kellam et al. |
| 2012/0213940 A1 | 8/2012 | Mallick |
| 2012/0216955 A1 | 8/2012 | Eto et al. |
| 2012/0217221 A1 | 8/2012 | Hoffman et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0239157 A1 | 9/2012 | Salvati et al. |
| 2012/0241082 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner, Jr. |
| 2012/0282779 A1 | 11/2012 | Arnold et al. |
| 2012/0285481 A1 | 11/2012 | Lee et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0305184 A1 | 12/2012 | Singh et al. |
| 2012/0309204 A1 | 12/2012 | Kang et al. |
| 2012/0309205 A1 | 12/2012 | Wang et al. |
| 2012/0322015 A1 | 12/2012 | Kim |
| 2012/0323008 A1 | 12/2012 | Barry et al. |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0020708 A1 | 1/2013 | Purayath et al. |
| 2013/0023062 A1 | 1/2013 | Masuda et al. |
| 2013/0023094 A1 | 1/2013 | Yeh et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0065403 A1 | 3/2013 | Paranjpe et al. |
| 2013/0082197 A1 | 4/2013 | Yang et al. |
| 2013/0084654 A1 | 4/2013 | Gaylord et al. |
| 2013/0087309 A1 | 4/2013 | Volfovski et al. |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0115372 A1 | 5/2013 | Pavol et al. |
| 2013/0118686 A1 | 5/2013 | Carducci et al. |
| 2013/0119016 A1 | 5/2013 | Kagoshima et al. |
| 2013/0119457 A1 | 5/2013 | Lue et al. |
| 2013/0119483 A1 | 5/2013 | Alptekin et al. |
| 2013/0127124 A1 | 5/2013 | Nam et al. |
| 2013/0130506 A1 | 5/2013 | Wang et al. |
| 2013/0130507 A1 | 5/2013 | Wang et al. |
| 2013/0133578 A1 | 5/2013 | Hwang |
| 2013/0133834 A1 | 5/2013 | Dhindsa |
| 2013/0149864 A1 | 6/2013 | Noguchi et al. |
| 2013/0150303 A1 | 6/2013 | Kungl et al. |
| 2013/0155568 A1 | 6/2013 | Todorow et al. |

(56) References Cited

U.S. PATENT DOCUMENTS

| | | |
|---|---|---|
| 2013/0161726 A1 | 6/2013 | Kim et al. |
| 2013/0168771 A1 | 7/2013 | Wu et al. |
| 2013/0171810 A1 | 7/2013 | Sun et al. |
| 2013/0175654 A1 | 7/2013 | Muckenhirn et al. |
| 2013/0187220 A1 | 7/2013 | Surthi |
| 2013/0193108 A1 | 8/2013 | Zheng et al. |
| 2013/0207267 A1 | 8/2013 | Rho et al. |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284288 A1 | 10/2013 | Kim |
| 2013/0284369 A1 | 10/2013 | Kobayashi et al. |
| 2013/0284370 A1 | 10/2013 | Collins et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0286532 A1 | 10/2013 | Kataigi et al. |
| 2013/0295297 A1 | 11/2013 | Chou et al. |
| 2013/0298942 A1 | 11/2013 | Ren et al. |
| 2013/0299009 A1 | 11/2013 | Jiang et al. |
| 2013/0302980 A1 | 11/2013 | Chandrashekar et al. |
| 2013/0306758 A1 | 11/2013 | Park et al. |
| 2013/0319854 A1 | 12/2013 | Parkhe et al. |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo et al. |
| 2014/0004906 A1 | 1/2014 | Chi et al. |
| 2014/0008880 A1 | 1/2014 | Miura et al. |
| 2014/0020708 A1 | 1/2014 | Kim et al. |
| 2014/0020924 A1 | 1/2014 | Nahmiyace et al. |
| 2014/0021673 A1 | 1/2014 | Chen et al. |
| 2014/0026813 A1 | 1/2014 | Wang et al. |
| 2014/0034239 A1 | 2/2014 | Yang et al. |
| 2014/0051253 A1 | 2/2014 | Guha |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0061324 A1 | 3/2014 | Mohn et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0073143 A1 | 3/2014 | Alokozai et al. |
| 2014/0076234 A1 | 3/2014 | Kao et al. |
| 2014/0080308 A1 | 3/2014 | Chen et al. |
| 2014/0080309 A1 | 3/2014 | Park et al. |
| 2014/0080310 A1 | 3/2014 | Chen et al. |
| 2014/0083362 A1 | 3/2014 | Lubomirsky et al. |
| 2014/0084471 A1 | 3/2014 | Peng et al. |
| 2014/0087488 A1 | 3/2014 | Nam et al. |
| 2014/0087561 A1 | 3/2014 | Lee et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0110061 A1 | 4/2014 | Okunishi |
| 2014/0116338 A1 | 5/2014 | He et al. |
| 2014/0124364 A1 | 5/2014 | Yoo et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0144876 A1 | 5/2014 | Nakagawa et al. |
| 2014/0147126 A1 | 5/2014 | Linnartz et al. |
| 2014/0148015 A1 | 5/2014 | Larson |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen et al. |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0179111 A1 | 6/2014 | Liu et al. |
| 2014/0186772 A1 | 7/2014 | Pohlers et al. |
| 2014/0190410 A1 | 7/2014 | Kim et al. |
| 2014/0190632 A1 | 7/2014 | Kumar et al. |
| 2014/0191388 A1 | 7/2014 | Chen |
| 2014/0191618 A1 | 7/2014 | Kijima et al. |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai |
| 2014/0248780 A1 | 9/2014 | Ingle et al. |
| 2014/0251956 A1 | 9/2014 | Jeon et al. |
| 2014/0252134 A1 | 9/2014 | Chen et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263177 A1 | 9/2014 | Povolny et al. |
| 2014/0263272 A1 | 9/2014 | Duan et al. |
| 2014/0264507 A1 | 9/2014 | Lee et al. |
| 2014/0264533 A1 | 9/2014 | Simsek-Ege et al. |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273410 A1 | 9/2014 | Abedijaberi et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao et al. |
| 2014/0288528 A1 | 9/2014 | Py |
| 2014/0302256 A1 | 10/2014 | Chen et al. |
| 2014/0302678 A1 | 10/2014 | Paterson et al. |
| 2014/0302680 A1 | 10/2014 | Singh et al. |
| 2014/0308758 A1 | 10/2014 | Nemani et al. |
| 2014/0308816 A1 | 10/2014 | Wang et al. |
| 2014/0310235 A1 | 10/2014 | Chan et al. |
| 2014/0311581 A1 | 10/2014 | Belostotskiy et al. |
| 2014/0334060 A1 | 11/2014 | Parkhe et al. |
| 2014/0335679 A1 | 11/2014 | Yalamanchili et al. |
| 2014/0342532 A1 | 11/2014 | Zhu et al. |
| 2014/0342569 A1 | 11/2014 | Zhu et al. |
| 2014/0343829 A1 | 11/2014 | Park |
| 2014/0345645 A1 | 11/2014 | Hoinkis et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2014/0373782 A1 | 12/2014 | Park et al. |
| 2015/0007770 A1 | 1/2015 | Chandrasekharan et al. |
| 2015/0011088 A1 | 1/2015 | McNie et al. |
| 2015/0011096 A1 | 1/2015 | Chandrasekharan et al. |
| 2015/0013793 A1 | 1/2015 | Chuc et al. |
| 2015/0014152 A1 | 1/2015 | Hoinkis et al. |
| 2015/0031211 A1 | 1/2015 | Sapre et al. |
| 2015/0037980 A1 | 2/2015 | Rha et al. |
| 2015/0041430 A1 | 2/2015 | Yoshino et al. |
| 2015/0044879 A1 | 2/2015 | Liao et al. |
| 2015/0050800 A1 | 2/2015 | Brand et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |

(56) References Cited

U.S. PATENT DOCUMENTS

| | | |
|---|---|---|
| 2015/0093891 A1 | 4/2015 | Zope et al. |
| 2015/0118822 A1 | 4/2015 | Zhang et al. |
| 2015/0118857 A1 | 4/2015 | Liu et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling et al. |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0155189 A1 | 6/2015 | Cho et al. |
| 2015/0167705 A1 | 6/2015 | Lee et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak et al. |
| 2015/0170935 A1 | 6/2015 | Wang et al. |
| 2015/0170943 A1 | 6/2015 | Nguyen et al. |
| 2015/0170956 A1 | 6/2015 | Naik et al. |
| 2015/0171008 A1 | 6/2015 | Luo et al. |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko |
| 2015/0214653 A1 | 7/2015 | Sakane et al. |
| 2015/0221541 A1 | 8/2015 | Nemani et al. |
| 2015/0228456 A1 | 8/2015 | Ye et al. |
| 2015/0228499 A1 | 8/2015 | Parkinson et al. |
| 2015/0235809 A1 | 8/2015 | Ito et al. |
| 2015/0235860 A1 | 8/2015 | Tomura et al. |
| 2015/0235863 A1 | 8/2015 | Chen et al. |
| 2015/0235865 A1 | 8/2015 | Wang et al. |
| 2015/0235867 A1 | 8/2015 | Nishizuka et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0262829 A1 | 9/2015 | Park et al. |
| 2015/0270105 A1 | 9/2015 | Kobayashi et al. |
| 2015/0270106 A1 | 9/2015 | Kobayashi et al. |
| 2015/0270135 A1 | 9/2015 | Tabat et al. |
| 2015/0270140 A1 | 9/2015 | Gupta et al. |
| 2015/0270366 A1 | 9/2015 | Purayath et al. |
| 2015/0275361 A1 | 10/2015 | Lubomirsky et al. |
| 2015/0275375 A1 | 10/2015 | Kim et al. |
| 2015/0277854 A1 | 10/2015 | Zhang |
| 2015/0279687 A1 | 10/2015 | Xue et al. |
| 2015/0287612 A1 | 10/2015 | Luere et al. |
| 2015/0294980 A1 | 10/2015 | Lee et al. |
| 2015/0303031 A1 | 10/2015 | Choi |
| 2015/0311089 A1 | 10/2015 | Kim et al. |
| 2015/0318186 A1 | 11/2015 | Zhang et al. |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345028 A1 | 12/2015 | Wang et al. |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371869 A1 | 12/2015 | Surla et al. |
| 2015/0371877 A1 | 12/2015 | Lin et al. |
| 2015/0372104 A1 | 12/2015 | Liu et al. |
| 2015/0376784 A1 | 12/2015 | Wu et al. |
| 2015/0380419 A1 | 12/2015 | Gunji-Yoneoka et al. |
| 2015/0380431 A1 | 12/2015 | Kanamori et al. |
| 2016/0002779 A1 | 1/2016 | Lin et al. |
| 2016/0005571 A1 | 1/2016 | Della Rosa et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042924 A1 | 2/2016 | Kim et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0064247 A1 | 3/2016 | Tomura et al. |
| 2016/0068969 A1 | 3/2016 | Cui et al. |
| 2016/0079062 A1 | 3/2016 | Zheng et al. |
| 2016/0079072 A1 | 3/2016 | Wang et al. |
| 2016/0086772 A1 | 3/2016 | Khaja et al. |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0097119 A1 | 4/2016 | Cui et al. |
| 2016/0099173 A1 | 4/2016 | Agarwal et al. |
| 2016/0104606 A1 | 4/2016 | Park et al. |
| 2016/0104648 A1 | 4/2016 | Park et al. |
| 2016/0109863 A1 | 4/2016 | Valcore, Jr. et al. |
| 2016/0111258 A1 | 4/2016 | Taskar et al. |
| 2016/0111315 A1 | 4/2016 | Parkhe |
| 2016/0117425 A1 | 4/2016 | Povolny et al. |
| 2016/0118227 A1 | 4/2016 | Valcore, Jr. et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141179 A1 | 5/2016 | Wu et al. |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0149937 A1 | 5/2016 | Katmor et al. |
| 2016/0163512 A1 | 6/2016 | Lubomirsky |
| 2016/0163513 A1 | 6/2016 | Lubomirsky |
| 2016/0163558 A1 | 6/2016 | Hudson et al. |
| 2016/0172216 A1 | 6/2016 | Marakhtanov et al. |
| 2016/0172226 A1 | 6/2016 | West et al. |
| 2016/0172238 A1 | 6/2016 | Kumar et al. |
| 2016/0181112 A1 | 6/2016 | Xue et al. |
| 2016/0181116 A1 | 6/2016 | Berry, III et al. |
| 2016/0189933 A1 | 6/2016 | Kobayashi et al. |
| 2016/0190147 A1 | 6/2016 | Kato et al. |
| 2016/0196969 A1 | 7/2016 | Berry, III et al. |
| 2016/0196984 A1 | 7/2016 | Lill et al. |
| 2016/0203952 A1 | 7/2016 | Tucker et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0217013 A1 | 7/2016 | Song et al. |
| 2016/0218018 A1 | 7/2016 | Liu et al. |
| 2016/0222522 A1 | 8/2016 | Wang et al. |
| 2016/0225616 A1 | 8/2016 | Li et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240344 A1 | 8/2016 | Kemen et al. |

(56) References Cited

U.S. PATENT DOCUMENTS

| | | |
|---|---|---|
| 2016/0240353 A1 | 8/2016 | Nagami |
| 2016/0240389 A1 | 8/2016 | Zhang et al. |
| 2016/0240402 A1 | 8/2016 | Park et al. |
| 2016/0254165 A1 | 9/2016 | Posseme |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293388 A1 | 10/2016 | Chen et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307743 A1 | 10/2016 | Brown et al. |
| 2016/0307771 A1 | 10/2016 | Xu et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0343548 A1 | 11/2016 | Howald et al. |
| 2016/0348244 A1 | 12/2016 | Sabri et al. |
| 2016/0351377 A1 | 12/2016 | Okamoto et al. |
| 2016/0358793 A1 | 12/2016 | Okumura et al. |
| 2016/0365228 A1 | 12/2016 | Singh et al. |
| 2017/0004975 A1 | 1/2017 | Farmer et al. |
| 2017/0011922 A1 | 1/2017 | Tanimura et al. |
| 2017/0030626 A1 | 2/2017 | Closs et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040198 A1 | 2/2017 | Lin et al. |
| 2017/0040207 A1 | 2/2017 | Purayath et al. |
| 2017/0040214 A1 | 2/2017 | Lai et al. |
| 2017/0042010 A1 | 2/2017 | Singh et al. |
| 2017/0042703 A1 | 2/2017 | Pusch et al. |
| 2017/0053808 A1 | 2/2017 | Kamp et al. |
| 2017/0062184 A1 | 3/2017 | Tran et al. |
| 2017/0104061 A1 | 4/2017 | Peng et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0133202 A1 | 5/2017 | Berry, III |
| 2017/0154784 A1 | 6/2017 | Wada |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178915 A1 | 6/2017 | Ingle et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0207099 A1 | 7/2017 | Ohtake et al. |
| 2017/0221708 A1 | 8/2017 | Bergendahl et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0250193 A1 | 8/2017 | Huo |
| 2017/0283947 A1 | 10/2017 | Rasheed et al. |
| 2017/0294445 A1 | 10/2017 | Son et al. |
| 2017/0306494 A1 | 10/2017 | Lin |
| 2017/0309509 A1 | 10/2017 | Tran et al. |
| 2017/0316920 A1 | 11/2017 | Melikyan et al. |
| 2017/0330728 A1 | 11/2017 | Bravo et al. |
| 2017/0335457 A1 | 11/2017 | Nguyen et al. |
| 2017/0338133 A1 | 11/2017 | Tan et al. |
| 2017/0338134 A1 | 11/2017 | Tan et al. |
| 2017/0342556 A1 | 11/2017 | Crook et al. |
| 2017/0362704 A1 | 12/2017 | Yamashita |
| 2017/0373082 A1 | 12/2017 | Sekine et al. |
| 2018/0005850 A1 | 1/2018 | Citla et al. |
| 2018/0005857 A1 | 1/2018 | Zhang et al. |
| 2018/0006041 A1 | 1/2018 | Xu et al. |
| 2018/0006050 A1 | 1/2018 | Watanabe et al. |
| 2018/0025900 A1 | 1/2018 | Park et al. |
| 2018/0033643 A1 | 2/2018 | Sharma et al. |
| 2018/0061618 A1 | 3/2018 | Nichols et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076048 A1 | 3/2018 | Gohira et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky |
| 2018/0096821 A1 | 4/2018 | Lubomirsky |
| 2018/0096865 A1 | 4/2018 | Lubomirsky |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0144970 A1 | 5/2018 | Chuang et al. |
| 2018/0151683 A1 | 5/2018 | Yeo et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0211862 A1 | 7/2018 | Konkola et al. |
| 2018/0223437 A1 | 8/2018 | George et al. |
| 2018/0337024 A1 | 11/2018 | Tan et al. |
| 2018/0337057 A1 | 11/2018 | Samir et al. |
| 2018/0342375 A1 | 11/2018 | Nguyen et al. |
| 2018/0350619 A1 | 12/2018 | Chen et al. |
| 2018/0366351 A1 | 12/2018 | Lubomirsky |
| 2019/0013211 A1 | 1/2019 | Wang et al. |
| 2019/0032211 A1 | 1/2019 | Tucker et al. |
| 2019/0037264 A1 | 1/2019 | Lyons et al. |
| 2019/0040529 A1 | 2/2019 | Verbaas et al. |
| 2019/0067006 A1 | 2/2019 | Hawrylchak et al. |
| 2019/0074191 A1 | 3/2019 | Nagatomo et al. |
| 2019/0252154 A1 | 8/2019 | Samir et al. |
| 2019/0252216 A1 | 8/2019 | Samir et al. |
| 2019/0271082 A1 | 9/2019 | Wang et al. |
| 2019/0272998 A1 | 9/2019 | Yang et al. |
| 2019/0311883 A1 | 10/2019 | Samir et al. |
| 2019/0333786 A1 | 10/2019 | Samir et al. |
| 2020/0060005 A1 | 2/2020 | Radermacher et al. |
| 2020/0087784 A1 | 3/2020 | Wu et al. |
| 2020/0215566 A1 | 7/2020 | Subbuswamy et al. |
| 2021/0005472 A1 | 1/2021 | Kanarik et al. |

FOREIGN PATENT DOCUMENTS

| | | |
|---|---|---|
| CN | 1412861 A | 4/2003 |
| CN | 1847450 A | 10/2006 |
| CN | 1891671 A | 1/2007 |
| CN | 100390957 C | 5/2008 |
| CN | 101202227 A | 6/2008 |
| CN | 101326629 A | 12/2008 |
| CN | 101378850 A | 3/2009 |
| CN | 101465386 A | 6/2009 |
| CN | 102160167 A | 8/2011 |
| CN | 101236893 B | 5/2012 |
| CN | 102844854 A | 12/2012 |
| CN | 102893705 A | 1/2013 |
| CN | 105580128 A | 5/2016 |
| EP | 1675160 A1 | 6/2006 |
| JP | 59126778 A | 7/1984 |
| JP | 63301051 A | 12/1988 |
| JP | 02114525 A | 4/1990 |
| JP | 044516 A | 1/1992 |
| JP | 0410307 A | 1/1992 |
| JP | 0636819 A | 2/1994 |

(56) References Cited

FOREIGN PATENT DOCUMENTS

| | | |
|---|---|---|
| JP | 07153739 A | 6/1995 |
| JP | 0831755 A | 2/1996 |
| JP | 08107101 A | 4/1996 |
| JP | 08264510 A | 10/1996 |
| JP | 09260356 A | 10/1997 |
| JP | 2001085393 A | 3/2001 |
| JP | 2001313282 A | 11/2001 |
| JP | 2001332608 A | 11/2001 |
| JP | 2001338917 A | 12/2001 |
| JP | 2002025992 A | 1/2002 |
| JP | 2002075972 A | 3/2002 |
| JP | 2002083869 A | 3/2002 |
| JP | 2002514010 A | 5/2002 |
| JP | 2003174020 A | 6/2003 |
| JP | 2003282591 A | 10/2003 |
| JP | 2004508709 A | 3/2004 |
| JP | 2004296467 A | 10/2004 |
| JP | 2005050908 A | 2/2005 |
| JP | 2006041039 A | 2/2006 |
| JP | 2006066408 A | 3/2006 |
| JP | 2008288560 A | 11/2008 |
| JP | 4191137 B2 | 12/2008 |
| JP | 2009141343 A | 6/2009 |
| JP | 2009530871 A | 8/2009 |
| JP | 2009239056 A | 10/2009 |
| JP | 2009290213 A | 12/2009 |
| JP | 2010180458 A | 8/2010 |
| JP | 2011508436 A | 3/2011 |
| JP | 2011518408 A | 6/2011 |
| JP | 4763293 B2 | 8/2011 |
| JP | 2011171378 A | 9/2011 |
| JP | 2011530833 A | 12/2011 |
| JP | 2012019164 A | 1/2012 |
| JP | 2012019194 A | 1/2012 |
| JP | 2012512531 A | 5/2012 |
| JP | 2013502718 A | 1/2013 |
| JP | 2013243418 A | 12/2013 |
| JP | 5802323 B2 | 10/2015 |
| JP | 2016111177 A | 6/2016 |
| KR | 1020000064946 A | 11/2000 |
| KR | 20030023964 A | 3/2003 |
| KR | 1020030030161 A | 4/2003 |
| KR | 1020030054726 A | 7/2003 |
| KR | 100441297 B1 | 7/2004 |
| KR | 1020050007143 A | 1/2005 |
| KR | 1020050042701 A | 5/2005 |
| KR | 1020050049903 A | 5/2005 |
| KR | 1020060080509 A | 7/2006 |
| KR | 100641762 B1 | 10/2006 |
| KR | 1020060127173 A | 12/2006 |
| KR | 100663668 B1 | 1/2007 |
| KR | 100678696 B1 | 1/2007 |
| KR | 100712727 B1 | 5/2007 |
| KR | 1020070079870 A | 8/2007 |
| KR | 100843236 B1 | 7/2008 |
| KR | 1020080063988 A | 7/2008 |
| KR | 20090040869 A | 4/2009 |
| KR | 1020090128913 A | 12/2009 |
| KR | 1020100013980 A | 2/2010 |
| KR | 1020100064946 A | 6/2010 |
| KR | 1020100093358 A | 8/2010 |
| KR | 1020110086540 A | 7/2011 |
| KR | 1020110114538 A | 10/2011 |
| KR | 1020110126675 A | 11/2011 |
| KR | 1020120022251 A | 3/2012 |
| KR | 1020120082640 A | 7/2012 |
| KR | 20160002543 A | 8/2016 |
| TW | 200709256 A | 3/2007 |
| TW | 200735196 A | 9/2007 |
| TW | 201127983 A | 8/2011 |
| TW | 201207919 A | 2/2012 |
| TW | 201213594 A | 4/2012 |
| TW | 201233842 A | 8/2012 |
| WO | 2005010971 A2 | 2/2005 |
| WO | 2008112673 A2 | 9/2008 |
| WO | 2009009611 A2 | 1/2009 |
| WO | 2009084194 A1 | 7/2009 |
| WO | 2010010706 A1 | 1/2010 |
| WO | 2010113946 A1 | 10/2010 |
| WO | 2011027515 A1 | 3/2011 |
| WO | 2011031556 A2 | 3/2011 |
| WO | 2011070945 A1 | 6/2011 |
| WO | 2011095846 A1 | 8/2011 |
| WO | 2011139435 A2 | 11/2011 |
| WO | 2011139435 A3 | 11/2011 |
| WO | 2011149638 A2 | 12/2011 |
| WO | 2012050321 A2 | 4/2012 |
| WO | 2012118987 A1 | 9/2012 |
| WO | 2012125656 A2 | 9/2012 |
| WO | 2013118260 A1 | 8/2013 |

OTHER PUBLICATIONS

"Bayard-Alpert Pirani Gauge FRG-730: Short Operating Instructions", Agilent Technologies, Manual No. TQMA72E1, Mar. 2012, pp. 1-45.

"Instrument Manual: Vacuum Gauge Model MM200", Televac, A Division of the Fredericks Company, 2008, 144 pages.

"Instrument Manual: Vacuum Gauge Model MM200, Rev D. Televac", Available online at: www.televac.com, A Division of the Fredericks Company, Huntingdonvalley, PA, US., 2008, 162 pages.

"International Search Report", PCT/US2009/059743, dated Oct. 18, 2011, 4.

"Merriam-Webster Dictionary Definition of Monolithic", Retrieved from https://www.merriam-webster.com/dictionary/monolithic, 2019, 1 page.

U.S. Appl. No. 12/551,180 , Silicon-Selective Dry Etch for Carbon-Containing Films, filed Aug. 31, 2009.

U.S. Appl. No. 12/646,030 , Smooth Siconi Etch for Silicon-Containing Films, filed Dec. 23, 2009.

Application No. PCT/US07/069996 , International Preliminary Report on Patentability, dated Dec. 3, 2008, 8 pages.

Application No. PCT/US07/069996 , International Search Report and Written Opinion, dated Aug. 7, 2008, 8 pages.

Application No. PCT/US07/69897 , International Preliminary Report on Patentability, dated Dec. 3, 2008, 5 pages.

Application No. PCT/US07/69897 , International Search Report and Written Opinion, dated Nov. 2, 2007, 5 pages.

Application No. PCT/US07/69999 , International Preliminary Report on Patentability, dated Dec. 3, 2008, 5 pages.

Application No. PCT/US07/69999 , International Search Report and Written Opinion, dated Dec. 6, 2007, 5 pages.

Application No. PCT/US07/70000 , International Preliminary Report on Patentability, dated Dec. 3, 2008, 6 pages.

Application No. PCT/US07/70000 , International Search Report and Written Opinion, dated Dec. 18, 2007, 6 pages.

Application No. PCT/US07/70001 , International Preliminary Report on Patentability, dated Dec. 3, 2008, 7 pages.

Application No. PCT/US07/70001 , International Search Report and Written Opinion, dated Aug. 5, 2008, 7 pages.

Application No. PCT/US08/82365 , International Search Report and Written Opinion, dated Jan. 6, 2009, 12 pages.

Application No. PCT/US2007/081139 , International Search Report and Written Opinion, dated Jul. 30, 2008, 19 pages.

Application No. PCT/US2009/041402 , International Search Report and Written Opinion, dated Dec. 23, 2009, 12 pages.

Application No. PCT/US2009/055073 , International Search Report and Written Opinion, dated Apr. 12, 2010, 12 pages.

Application No. PCT/US2009/059743 , International Search Report and Written Opinion, dated Apr. 26, 2010, 4.

Application No. PCT/US2010/045056 , International Preliminary Report on Patentability, dated Mar. 15, 2012, 7 pages.

Application No. PCT/US2010/045056 , International Search Report and Written Opinion, dated Mar. 23, 2011, 8 pages.

Application No. PCT/US2010/057676 , International Preliminary Report on Patentability, dated Jul. 5, 2012, 6 pages.

Application No. PCT/US2010/057676 , International Search Report and Written Opinion, International Search Report and Written

(56) References Cited

OTHER PUBLICATIONS

Opinion of the International Searching Authority for corresponding International Application, dated Jun. 27, 2011, 9.
Application No. PCT/US2011/027221, International Preliminary Report on Patentability, dated Sep. 27, 2012, 5 pages.
Application No. PCT/US2011/027221, International Search Report and Written Opinion, dated Nov. 1, 2011, 8.
Application No. PCT/US2011/030582, International Preliminary Report on Patentability, dated Nov. 15, 2012, 6 pages.
Application No. PCT/US2011/030582, International Search Report and Written Opinion, dated Dec. 7, 2011, 9.
Application No. PCT/US2011/035598, International Preliminary Report on Patentability, dated Dec. 6, 2012, 7 pages.
Application No. PCT/US2011/035598, International Search Report and Written Opinion, dated Jan. 18, 2012, 10.
Application No. PCT/US2011/064724, International Preliminary Report on Patentability, dated Jun. 27, 2013, 5 pages.
Application No. PCT/US2011/064724, International Search Report and Written Opinion Received, dated Oct. 12, 2012, 8.
Application No. PCT/US2011/066281, International Search Report and Written Opinion, dated Jul. 19, 2012, 10 pages.
Application No. PCT/US2012/028310, International Search Report and Written Opinion, dated Oct. 18, 2012, 8.
Application No. PCT/US2012/028952, International Search Report and Written Opinion, dated Oct. 29, 2012, 9.
Application No. PCT/US2012/028957, International Preliminary Report on Patentability, dated Sep. 26, 2013, 6 pages.
Application No. PCT/US2012/028957, International Search Report and Written Opinion, dated Oct. 18, 2012, 9.
Application No. PCT/US2012/048842, International Preliminary Report on Patentability, dated Feb. 27, 2014, 7 pages.
Application No. PCT/US2012/048842, International Search Report and Written Opinion Received, dated Nov. 28, 2012, 10.
Application No. PCT/US2012/049768, International Preliminary Report on Patentability, dated Mar. 13, 2014, 5 pages.
Application No. PCT/US2012/049768, International Search Report and Written Opinion Received, dated Jan. 31, 2013, pp. 8.
Application No. PCT/US2012/053329, International Preliminary Report on Patentability, dated Mar. 13, 2014, 5 pages.
PCT/US2012/053329, "International Search Report and Written opinion", dated Feb. 15, 2013, 8 Pages.
Application No. PCT/US2012/057294, International Preliminary Report on Patentability, dated Apr. 10, 2014, 9 pages.
PCT/US2012/057294, "International Search Report and Written opinion", dated Mar. 18, 2013, 12 Pages.
Application No. PCT/US2012/057358, International Preliminary Report on Patentability, dated Apr. 10, 2014, 6 pages.
Application No. PCT/US2012/057358, International Search Report & Written Opinion, dated Mar. 25, 2013, 10 pages.
Application No. PCT/US2012/058818, International Preliminary Report on Patentability, dated Apr. 17, 2014, 6 pages.
Application No. PCT/US2012/058818, International Search Report & Written Opinion, dated Apr. 1, 2013, 9 pages.
Application No. PCT/US2012/23356, International Preliminary Report on Patentability, dated Sep. 6, 2013, 7 pages.
Application No. PCT/US2012/23356, International Search Report and Written Opinion, dated Sep. 24, 2012, 3.
Application No. PCT/US2013/037202, International Preliminary Report on Patentability, dated Nov. 27, 2014, 8 pages.
Application No. PCT/US2013/037202, International Search Report & Written Opinion, dated Aug. 23, 2013, 11 pages.
Application No. PCT/US2013/048931, International Preliminary Report on Patentability, dated Jan. 29, 2015, 6 pages.
Application No. PCT/US2013/048931, International Search Report and Written Opinion, dated Oct. 10, 2013, 7 pages.
Application No. PCT/US2013/052039, International Preliminary Report on Patentability, dated Feb. 12, 2015, 6 pages.
Application No. PCT/US2013/052039, International Search Report and Written Opinion, dated Nov. 8, 2013, 7 pages.
Application No. PCT/US2013/056243, International Preliminary Report on Patentability, dated Mar. 26, 2016, 7 pages.
Application No. PCT/US2013/056243, International Search Report and Written Opinion Received, dated Dec. 17, 2013, 10 pages.
Application No. PCT/US2013/056636, International Preliminary Report on Patentability, dated Apr. 2, 2015, 7 pages.
Application No. PCT/US2013/056636, International Search Report and Written Opinion, dated Dec. 27, 2013, 8 pages.
Application No. PCT/US2013/057253, International Preliminary Report on Patentability, dated Apr. 2, 2015, 5 pages.
Application No. PCT/US2013/057253, International Search Report and Written Opinion, dated Nov. 28, 2013, 6 pages.
Application No. PCT/US2013/057599, International Preliminary Report on Patentability, dated Apr. 2, 2015, 7 pages.
Application No. PCT/US2013/057599, International Search Report and Written Opinion, dated Dec. 26, 2013, 8 pages.
Application No. PCT/US2013/058778, International Preliminary Report on Patentability, dated Apr. 2, 2015, 8 pages.
Application No. PCT/US2013/058778, International Search Report and Written Opinion, dated Dec. 27, 2013, 9 pages.
Application No. PCT/US2013/068337, International Preliminary Report on Patentability, dated May 21, 2015, 5 pages.
Application No. PCT/US2013/068337, International Search Report and Written Opinion, dated Feb. 25, 2014, 8 pages.
Application No. PCT/US2013/070600, International Search Report and Written Opinion, dated Feb. 26, 2014, 8 pages.
PCT/US2013/070600, "Supplementary International Search Report", dated Mar. 17, 2015, 6 pages.
Application No. PCT/US2013/071417, International Preliminary Report on Patentability, dated Jul. 2, 2015, 7 pages.
Application No. PCT/US2013/071417, International Search Report and Written Opinion, dated Apr. 8, 2014, 8 pages.
PCT/US2013/071417, "Supplementary International Search Report", dated Mar. 13, 2015, 5 pages.
Application No. PCT/US2013/076217, International Preliminary Report on Patentability, dated Jul. 30, 2015, 8 pages.
Application No. PCT/US2013/076217, International Search Report and Written Opinion, dated Apr. 28, 2014, 9 pages.
Application No. PCT/US2014/013138, International Preliminary Report on Patentability, dated Aug. 20, 2015, 9 pages.
Application No. PCT/US2014/013138, International Search Report and Written Opinion, dated May 20, 2014, 10 pages.
Application No. PCT/US2014/018041, International Preliminary Report on Patentability, dated Sep. 11, 2015, 8 pages.
Application No. PCT/US2014/018041, International Search Report and Written Opinion, dated Jun. 17, 2014, 22 pages.
Application No. PCT/US2014/018181, International Preliminary Report on Patentability, dated Sep. 17, 2015, 8 pages.
Application No. PCT/US2014/018181, International Search Report and Written Opinion, dated Jun. 24, 2014, 11 pages.
Application No. PCT/US2014/021246, International Preliminary Report on Patentability, dated Sep. 24, 2015, 7 pages.
Application No. PCT/US2014/021246, International Search Report and Written Opinion, dated Jun. 18, 2014, 9 pages.
Application No. PCT/US2014/033263, International Preliminary Report on Patentability, dated Oct. 29, 2015, 9 pages.
PCT/US2014/033263, "International Search Report and Written opinion", dated Aug. 27, 2014, 12 pages.
Application No. PCT/US2014/049215, International Preliminary Report on Patentability, dated Mar. 31, 2016, 9 pages.
Application No. PCT/US2014/049215, International Search Report and Written Opinion, dated Nov. 14, 2014, 12 pages.
Application No. PCT/US2014/050824, International Search Report and Written Opinion, dated Nov. 18, 2014, 9 pages.
Application No. PCT/US2014/063891, International Preliminary Report on Patentability, dated Jun. 30, 2016, 8 pages.
Application No. PCT/US2014/063891, International Search Report and Written Opinion, dated Jan. 30, 2015, 11 pages.
Application No. PCT/US2014/066176, International Preliminary Report on Patentability, dated Jun. 30, 2016, 6 pages.
Application No. PCT/US2014/066176, International Search Report and Written Opinion, dated Feb. 26, 2015, 9 pages.

(56) References Cited

OTHER PUBLICATIONS

Application No. PCT/US2014/067135, International Preliminary Report on Patentability, dated Jun. 30, 2016, 8 pages.
Application No. PCT/US2014/067135, International Search Report and Written Opinion, dated Feb. 25, 2015, 12 pages.
Application No. PCT/US2014/071969, International Preliminary Report on Patentability, dated Aug. 11, 2016, 9 pages.
Application No. PCT/US2014/071969, International Search Report and Written Opinion, dated Apr. 20, 2015, 12 pages.
Application No. PCT/US2015/020186, International Search Report and Written Opinion, dated Jun. 24, 2015, 10 pages.
Application No. PCT/US2015/021249, International Preliminary Report on Patentability, dated Oct. 13, 2016, 6 pages.
PCT/US2015/021249, "International Search Report and written opinion", dated Jun. 26, 2015, 15 pages.
Application No. PCT/US2015/051628, International Search Report and Written Opinion, dated Feb. 23, 2016, 11 pages.
Application No. PCT/US2015/051636, International Preliminary Report on Patentability, dated Apr. 27, 2017, 7 pages.
Application No. PCT/US2015/051636, International Search Report and Written Opinion, dated Dec. 21, 2015, 8 pages.
Application No. PCT/US2015/059660, International Preliminary Report on Patentability, dated Jun. 8, 2017, 9 pages.
Application No. PCT/US2015/059660, International Search Report and Written Opinion, dated Feb. 19, 2016, 10 pages.
Application No. PCT/US2015/061246, International Preliminary Report on Patentability, dated Jun. 22, 2017, 9 pages.
Application No. PCT/US2015/061246, International Search Report and Written Opinion, dated Mar. 31, 2016, 14 pages.
Application No. PCT/US2015/061372, International Preliminary Report on Patentability, dated Jun. 22, 2017, 10 pages.
Application No. PCT/US2015/061372, International Search Report and Written Opinion, dated Feb. 26, 2016, 12 pages.
Application No. PCT/US2015/065719, International Search Report and Written Opinion, dated Feb. 25, 2016, 8 pages.
Application No. PCT/US2015/067272, International Search Report and Written Opinion, dated Mar. 31, 2016, 10 pages.
Application No. PCT/US2016/014079, International Preliminary Report on Patentability, dated Aug. 17, 2017, 12 pages.
Application No. PCT/US2016/014079, International Search Report and Written Opinion, dated Apr. 25, 2016, 16 pages.
Application No. PCT/US2016/014106, International Preliminary Report on Patentability, dated Aug. 17, 2017, 12 pages.
Application No. PCT/US2016/014106, International Search Report and Written Opinion, dated Apr. 26, 2016, 17 pages.
Application No. PCT/US2016/045543, International Preliminary Report on Patentability, dated Feb. 15, 2018, 11 pages.
Application No. PCT/US2016/045543, International Search Report and Written Opinion, dated Nov. 17, 2016, 14 pages.
Application No. PCT/US2016/045551, International Preliminary Report on Patentability, dated Feb. 15, 2018, 11 pages.
Application No. PCT/US2016/045551, International Search Report and Written Opinion, dated Nov. 17, 2016, 14 pages.
Application No. PCT/US2017/033362, International Search Report and Written Opinion, dated Aug. 24, 2017, 13 pages.
Application No. PCT/US2017/047209, International Search Report and Written Opinion, dated Nov. 24, 2017, 12 pages.
Application No. PCT/US2017/055431, International Search Report and Written Opinion, dated Jan. 19, 2018, 5 pages.
Application No. PCT/US2017/060696, International Search Report and Written Opinion, dated Jan. 25, 2018, 11 pages.
Application No. PCT/US2018/016261, International Search Report and Written Opinion, dated May 21, 2018, 10 pages.
Application No. PCT/US2018/016648, International Search Report and Written Opinion, dated May 18, 2018, 13 pages.
Wang et al., "Inductively Coupled Plasma Etching of Bulk 6H—SiC and Thin-Film SiCN in NF3 Chemistries", Journal of Vacuum Science and Technology, vol. 16, No. 4, Aug. 1998, pp. 2204-2209.
Won et al., "Formation of Multilayer Enscapulating Film Over Substrate, e.g. Displace Device, Comprising Delivering Mixture Precursors and Hydrogen Gas into Substrate Processing System", Derwent 2006-065772, Sep. 7, 2014, 10 pages.

* cited by examiner

LOW TEMPERATURE CHUCK FOR PLASMA PROCESSING SYSTEMS

CROSS REFERENCES TO RELATED APPLICATIONS

This application is a continuation of U.S. patent Ser. No. 15/581,497, filed Apr. 28, 2017, which is a continuation of U.S. patent application Ser. No. 14/612,857, filed Feb. 3, 2015, the entire disclosure of which is incorporated by reference herein for all purposes.

TECHNICAL FIELD

The present disclosure applies broadly to the field of plasma processing equipment. More specifically, systems and methods for providing spatially uniform plasma processing on a workpiece are disclosed.

BACKGROUND

Integrated circuits and other semiconductor products are often fabricated on surfaces of substrates called "wafers." Sometimes processing is performed on groups of wafers held in a carrier, while other times processing and testing are performed on one wafer at a time. When single wafer processing or testing is performed, the wafer may be positioned on a wafer chuck. Other workpieces may also be processed on similar chucks.

SUMMARY

In an embodiment, a wafer chuck assembly includes a puck, a shaft and a base. The puck includes an electrically insulating material that defines a top surface of the puck; a plurality of electrodes are embedded within the electrically insulating material. The puck also includes an inner puck element that forms one or more channels for a heat exchange fluid, the inner puck element being in thermal communication with the electrically insulating material, and an electrically conductive plate disposed proximate to the inner puck element. The shaft includes an electrically conductive shaft housing that is electrically coupled with the plate, and a plurality of connectors, including electrical connectors for the electrodes. The base includes an electrically conductive base housing that is electrically coupled with the shaft housing, and an electrically insulating terminal block disposed within the base housing, the plurality of connectors passing through the terminal block.

In an embodiment, a method of plasma processing includes stabilizing temperature of a chuck by a heat exchange fluid through an inner puck element of the chuck, the chuck having an electrically insulating top surface in thermal communication with the inner puck element, loading a workpiece onto the chuck, and providing a DC voltage differential across two spatially separated electrodes within the electrically insulating top surface, to clamp the workpiece to the chuck. The method further includes providing process gases in a chamber surrounding the chuck, and providing an RF voltage between a conductive plate beneath the chuck, and one or more walls of the chamber, to ignite a plasma from the process gases.

DETAILED DESCRIPTION

Figure 1:
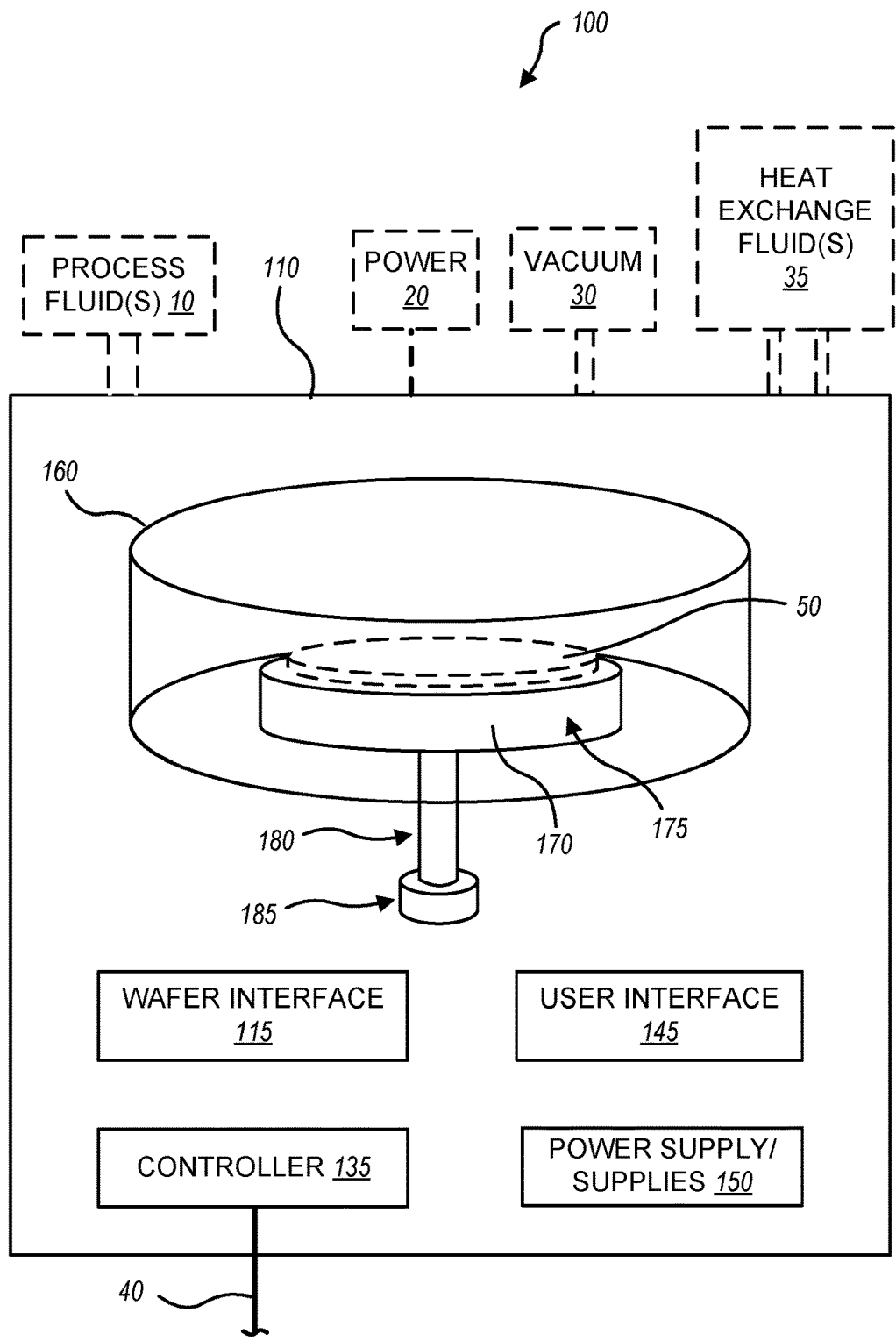
FIG. 1 schematically illustrates major elements of a wafer processing system, according to an embodiment.

The present disclosure may be understood by reference to the following detailed description taken in conjunction with the drawings described below, wherein like reference numerals are used throughout the several drawings to refer to similar components. It is noted that, for purposes of illustrative clarity, certain elements in the drawings may not be drawn to scale. Specific instances of an item may be referred to by use of a numeral in parentheses (e.g., connectors 230(1), 230(2), etc.) while numerals without parentheses refer to any such item (e.g., connectors 230). In instances where multiple instances of an item are shown, only some of the instances may be labeled, for clarity of illustration.

Embodiments herein provide new and useful functionality for wafer processing systems. Semiconductor wafer sizes have increased while feature sizes have decreased significantly over the years, so that more integrated circuits with greater functionality can be harvested per wafer processed. Typical wafer diameters increased from about 2 or 3 inches in the 1970s to 12 inches or more in the 2010s. Over the same time frame, typical minimum feature sizes of commercial integrated circuits decreased from about 5 microns to about 0.015 microns. Processing smaller features while wafers grow larger requires significant improvements in processing uniformity. Because chemical reaction rates are often temperature sensitive, point to point temperature control across wafers during processing is becoming more important. For example, in certain types of processing, point to point temperature differences within a wafer of a few degrees Celsius may have been acceptable in the past, but now such differences may need to be held to about a degree or less. Certain materials used in fabrication of integrated circuits and other devices may also require processing in very corrosive plasma environments. Plasma processing of workpieces other than wafers may also benefit from improved processing uniformity, and are considered within the scope of the present disclosure. Thus, characterization of the chucks herein as "wafer chucks" for holding "wafers" should be understood as equivalent to "chucks" for holding "workpieces" of any sort, and "wafer processing systems" as similarly equivalent to "processing systems."

FIG. 1 schematically illustrates major elements of a wafer processing system 100. System 100 is depicted as a single wafer, semiconductor wafer processing system, but it will be apparent to one skilled in the art that the techniques and principles herein are applicable to plasma processing systems of any type (e.g., systems that process workpieces of other types, not necessarily semiconductors or wafers). It should also be understood that FIG. 1 is a diagram that only schematically illustrates selected, major elements of system 100; an actual processing system will accordingly look different and likely contain additional elements as compared with system 100.

Wafer processing system 100 is serviced by one or more utilities such as process fluid(s) 10, external power 20, vacuum 30 and heat exchange fluid(s) 35. Wafer processing system 100 includes a housing 110 and a wafer interface 115 that receives wafers 50 from external sources and positions them within a processing location 160. Wafer processing system 100 may also include a user interface 145, and a controller 135 that typically includes a microprocessor, memory and the like, may take input from user interface 145 and/or other sources, and provides computer based control over the hardware elements of wafer processing system 100. Controller 135 may interface with external networks and/or computers over one or more data links 40 that may be physical (wires or optical connectors) or wireless connections. Wafer processing system 100 may also include one or more internal power supplies 150 that transform or condition power supplied by external power for use by the hardware elements of the system.

Processing location 160 receives each wafer 50 onto a wafer chuck 170 that, in embodiments, includes three portions: a puck 175, a shaft 180 that supports puck 175, and a base 185 that supports shaft 180. Wafer 50 is physically positioned on, and in embodiments is heated, cooled and/or mechanically held by, puck 175. Wafer chuck 170 is also configured to couple radio frequency (RF) and/or direct current (DC) voltages to wafer 50, for electrostatic clamping of wafer 50 to puck 175, for generating a plasma within processing location 160 and/or for directing reactive ions from the plasma to wafer 50. Processing location 160 thus exposes wafer 50 to "plasma products," defined herein as any material that is, or has at one time been, part of a plasma. Plasma products may include any or all of ions, radicals, molecular fragments of source gases, other activated species, and/or source gas atoms or molecules that were part of a plasma but were not transformed into ions, radicals and so forth. Gases that have not formed part of a plasma at any time are defined herein as "unactivated gases."

Puck 175 and/or shaft 180 are also, in embodiments, configured to manipulate wafer 50 for access to wafer handling tools. For example, in embodiments, shaft 180 may raise puck 175 for a wafer 50 to be received thereon, and subsequently lower puck 175 to another height for processing, or the reverse. In these or other embodiments, puck 175 and/or shaft 180 may include actuators that raise or lower wafer 50 relative to a top surface of puck 175, such as lift pins that can extend from or retract within puck 175, such that a wafer tool may be inserted between wafer 50 and the top surface. Shaft 180 may also facilitate electrical and/or fluid connections with puck 175. Base 185 mechanically anchors shaft 180 within housing 110 and, in embodiments, provides interfaces for electrical utilities and/or fluids to shaft 180. Portions of base 185, shaft 180 and puck 175, or any combination thereof, may be formed monolithically with one another, or may be assembled partially or completely from component parts, as further described below.

Figure 2:
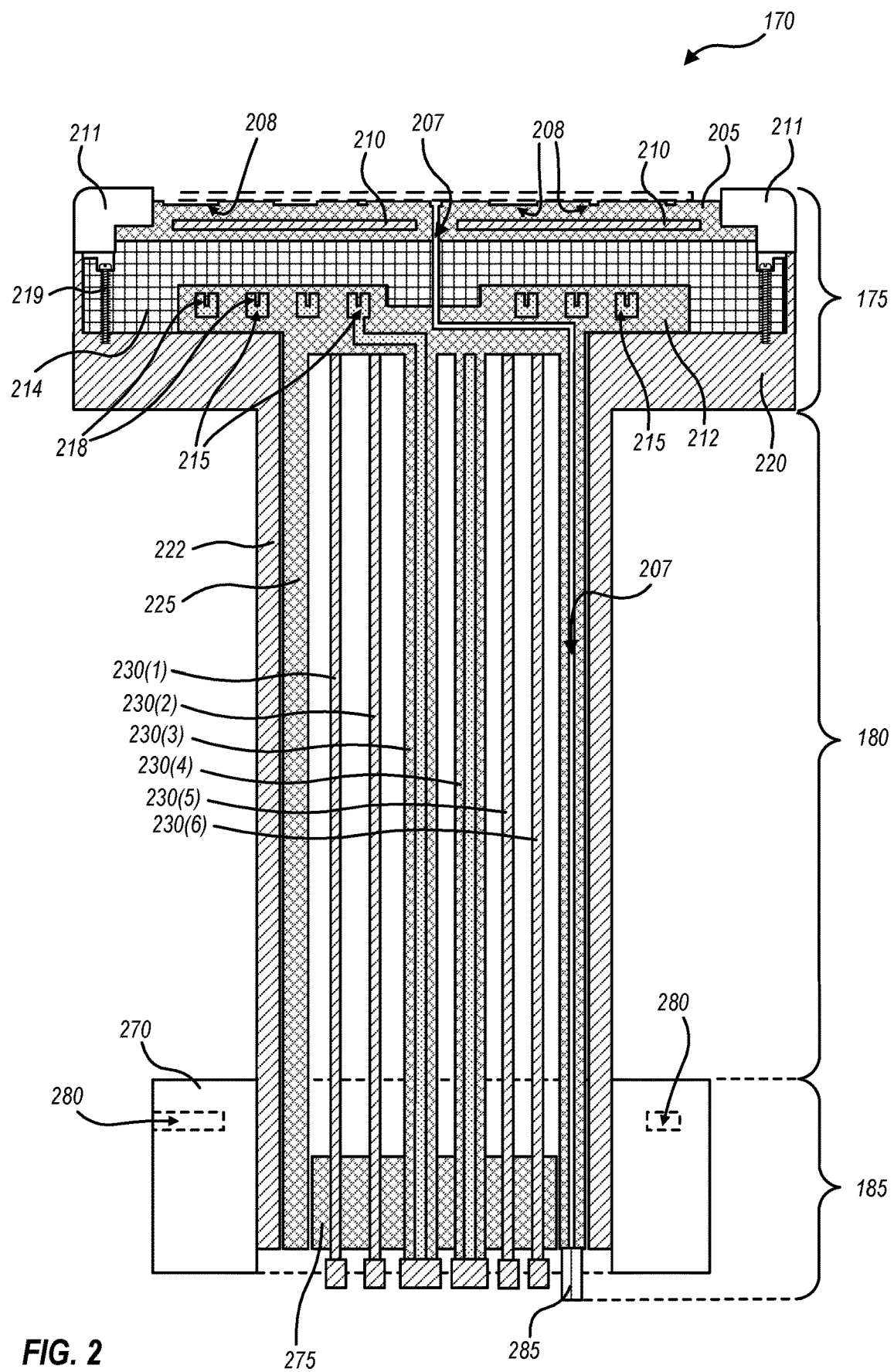
FIG. 2 is a schematic illustration of a wafer chuck shown in FIG. 1, showing exemplary component parts thereof, according to an embodiment.

FIG. 2 is a schematic illustration of wafer chuck 170, showing exemplary component parts thereof. FIG. 2 is not drawn to scale, certain components of wafer chuck 170 are exaggerated or diminished in size, not every instance of each component is labeled, and not all internal connections among components are shown, for illustrative clarity. Regions of wafer chuck 170 are identified as puck 175, shaft 180 and base 185, as per FIG. 1, although certain components of wafer chuck 170 may overlap two or more of these regions. Puck 175 includes an insulating top 205 in which are embedded electrodes 210. Top 205 may be formed of ceramic or other electrically insulating material; for example, in embodiments, top 205 is formed of aluminum nitride or alumina. Electrodes 210 may be formed of conductive and/or resistive materials that can withstand moderate to high temperatures, such as tungsten oxide, for example.

An optional channel 207 within top 205 brings a heat transfer gas such as helium into contact with a backside of wafer 50 to improve heat transfer between top 205 and wafer 50. The improved heat transfer can help in cases where a wafer is not perfectly flat, and thus is not in uniform contact with the top surface of top 205, and/or to improve thermal uniformity from the range of a few degrees point-to-point on a wafer, to the range of one degree or less. Optional channels 208 interconnect with channel 207 and with one another within a top surface of top 205, so that the heat transfer gas can spread between the bottom surface of wafer 50 and top 205 until the gas passes an outer edge of wafer 50.

An electrically conductive plate 220 that may be formed of metal, for example, of aluminum or alloys thereof, is disposed beneath top 205. Plate 220 supports an inner puck element 212 in which one or more heat exchange channels 215 are defined. Heat exchange channels 215 may, for example, be defined in a spiral configuration within inner puck element 212. Heat exchange channels 215 may define internal fins 218, as shown, to improve thermal coupling between heat exchange fluid 35 (see FIG. 1) flowing within channels 215, and inner puck element 212.

Disposed above inner puck element 212 and plate 220 is a connective element 214. Connective element 214 is advantageously formed of a material that has both high thermal conductivity and reasonably high ductility, to accommodate mechanical stresses and/or thermal expansion mismatch with adjacent components during temperature changes. In embodiments, fabrication of connective element 214 is advantageously fabricated of aluminum silicon carbide (AlSiC), which features high thermal conductivity and at least higher ductility than puck inner element 212 and top 205. Use of AlSiC may be considered unusual due to its expense, but has been found to yield unexpectedly good results as compared to use of more conventional materials. Connective element 214 may fasten to plate 220 using bolts 219, as shown.

In embodiments, top 205 is held in place over connective element 214 with a ring 211, made for example of ceramic. Ring 211 may be press-fit over top 205 and about connective element 214, as shown, to provide mechanical stability and good thermal coupling, while not fastening ring 211 and/or top 205 rigidly with connective element 214 or plate 220. Attaching top 205 in this manner advantageously accommodates slight thermal expansion mismatches among top 205, ring 211 and connective element 214 during heating or cooling. Ring 211 also protects bolts 219 from exposure to plasma and/or plasma products outside chuck 170.

In shaft 180, an electrically conductive shaft housing 222 is below top 205 and forms a housing for shaft 180. Shaft housing 222 may also be made, for example, of aluminum; plate 220 and shaft housing 222 are electrically coupled and may be integrally formed, as shown in FIG. 2, or assembled by fastening or joining component parts. Shaft housing 222 houses an optional insulating liner 225, made for example of a ceramic material such as AlN or $Al_2O_3$, that helps keep internal components from shorting or arcing to shaft housing 222. Insulating liner 225 may be integrally formed with inner puck element 212, as shown in FIG. 2, or may be formed separately therefrom. Interior surfaces of insulating liner 225 may, optionally, be flushed with inert gases such as helium or nitrogen to remove heat or to dilute and remove process gases that may enter the chuck surface as wafers are transferred to and from chuck 170.

Shaft 180 also houses a variety of connectors 230 between power supplies and other facilities of equipment in which chuck 170 is located, and features of puck 175. Exemplary connectors 230 shown in FIG. 2 include radio-frequency/direct current (RF/DC) connectors 230(1), 230(2); a heat exchange fluid inlet and outlet 230(3), 230(4); a probe center-tap terminal 230(5); and a thermocouple (TC) or resistance temperature detector (RTD) wire 230(6) (e.g., a two-element wire, shown schematically as a single connector in FIG. 2). Other connectors 230 are possible, in embodiments. Connectors 230 may be single or twisted pair wires, rods, coaxial or other connectors, insulated or uninsulated wires, or fluid conduits. In embodiments, radio-frequency/direct current (RF/DC) connectors 230(1), 230(2) include an inner conductor, an insulating layer about the inner conductor, a ground tube about the insulating layer, and a ceramic tube about the ground tube. Connectors 230 that are fluid conduits may be integrally formed with puck and/or base elements, such as heat exchange fluid inlet and outlet 230(3), 230(4) integrally formed with inner puck element 212, as shown in FIG. 2.

TCs or RTDs may be implemented in any number and may optionally be organized for sensitivity to temperature variations caused by temperature and flow rate of heat exchange fluid 35, heating by plasma or plasma products, heating or cooling caused by interaction with flowing gases or plasma products, or other causes. In embodiments, characterization of chuck 170 may lead to a determination that temperature is uniform across a given configuration of chuck 170, such that a single TC or RTD accurately represents the temperature of chuck 170. In other embodiments, multiple TCs or RTDs can be used to monitor temperature uniformity across chuck 170, providing information that can be used to a automatically and/or manually adjust operation of heat exchange fluids 35 or other aspects of a plasma processing system in which chuck 170 is located, to promote temperature uniformity.

Connectors 230 may also be fluid conduits. Additionally, or instead of connectors 230 being configured as fluid conduits, shaft housing 222, insulating liner 225 and/or spaces among or between them may be configured with fluid passages. For example, a backside gas source 285 supplies He or other inert gas to channel 207, for improved thermal control across wafer 50.

Use of heat exchange fluid(s) 35 to heat and/or cool puck 175 simplifies thermal management of chuck 170, and a wafer 50 processed thereon, in a relatively low temperature regime, such as the range of about 20 C to 150 C. For example, an external heat exchanger may be set to provide a heating/cooling fluid such as a mixture of 50% water, 50% ethylene or propylene glycol at the desired chuck temperature. Puck 175 is provided with a high thermal mass that wafer 50 loaded onto puck 175 rapidly comes into thermal equilibrium with puck 175 at the desired temperature; inclusion of a connective element 214 formed of AlSiC helps to provide the high thermal mass. Thermal conductivity of puck 175 and flow rate of the heat exchange fluid are great enough that puck 175 and wafer 50 remain at the desired temperature despite heating and/or cooling effects of plasma generation, gas flows within processing location 160, and the like.

The number and arrangement of connectors 230 in FIG. 2 is schematic only; connectors 230 may, and usually will, be arranged differently for purposes such as minimizing size of shaft 180, maximizing space between adjacent connectors 230, improving temperature uniformity and/or heat dissipation, and other reasons.

Base 185 of chuck 170 includes an electrically conductive base housing 270 that may be made of metal (for example, of aluminum) and may be may be integrally formed with shaft housing 222 or assembled to it by fasteners, welding or the like. In embodiments, base housing 270 includes an electrically insulating terminal block 275 through which connectors 230 pass. Terminal block 275 serves to align connectors 230-265 such that their respective distal ends are arranged to mate with corresponding sockets within puck 175. Terminal block 275 may be formed of an insulator such as polyether ether ketone (PEEK) or ceramic, which both provide good electrical resistance and stability at high temperatures.

Base housing 270 may include channels such as channel 280 therein for heat exchange fluid 35 (FIG. 1), as shown. Heat exchange fluid 35 passing through channel 280 may be either a gas or a liquid. In embodiments, heat exchange fluid 35 passed through channel 280 is a mixture of water and ethylene glycol or propylene glycol, having a mix ratio of approximately 50% water, 50% glycol. In embodiments, cooling provided through channel 280 cools not only base housing 270, but also shaft housing 222 and conductive plate 220 mechanically connected therewith. By using heat exchange fluid 35 both in base 185 and in inner puck element 212, chuck 170 can provide exceptionally stable thermal performance.

Base 185 may be fixed within an associated piece of wafer processing equipment, or may be movably mounted using slides, hinges, stages or other devices to position puck 175 to send or receive a wafer or other workpiece, and/or to align the wafer or workpiece as needed.

Figure 3:
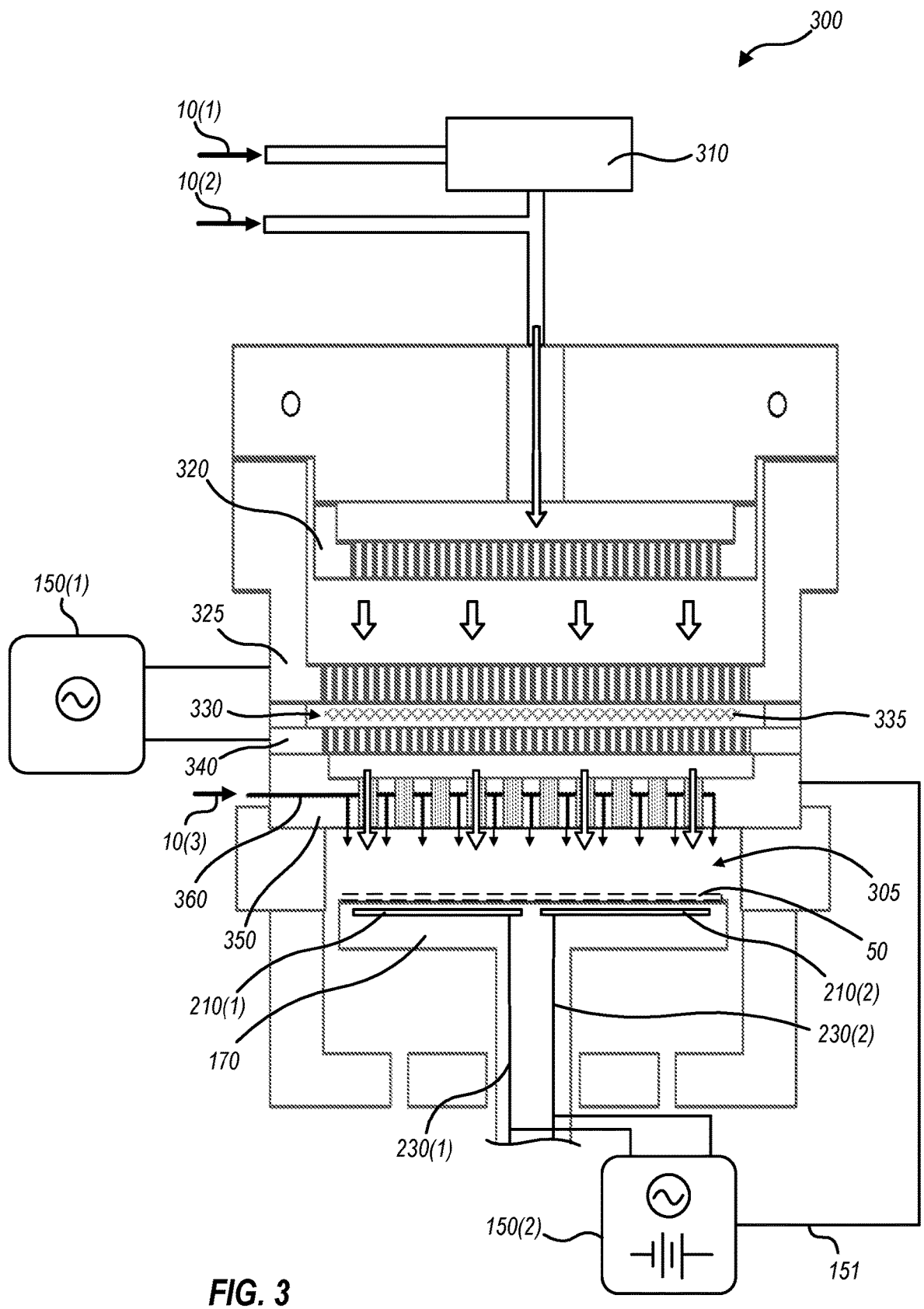
FIG. 3 is a schematic illustration of a plasma wafer processing system including a wafer chuck, showing exemplary component parts thereof, according to an embodiment.

FIG. 3 is a schematic illustration of a plasma wafer processing system 300 including wafer chuck 170, showing exemplary component parts thereof. FIG. 3 is not drawn to scale, certain components of plasma wafer processing system 300 are exaggerated or diminished in size, not every instance of each component is labeled, and not all internal connections among components are shown, for illustrative clarity. Plasma wafer processing system 300 is an example of wafer processing system 100, FIG. 1. Plasma wafer processing system 300 processes a wafer 50 within a process chamber 305 using plasma products and/or unactivated gases; FIG. 3 shows flows of plasma products as open arrows and of unactivated gases as solid arrows. An optional remote plasma source 310 generates a first plasma (not shown) from a first input gas stream 10(1) and optionally mixes resulting plasma products with a second input gas stream 10(2), passing the plasma products toward a diffuser 320. The plasma products may pass through further, optional diffusers 320, 325 and 340 that serve at least to distribute the plasma products uniformly before they are introduced into process chamber 305. In the configuration shown, a first power supply 150(1) provides RF energy across a space 330 between diffusers 325 and 340, forming a second plasma 335 in space 330. Plasma products from the first and second plasmas may optionally mix with a further input gas stream 10(3) through a further diffuser 350 (sometimes referred to as a "showerhead"). Diffuser 350 is configured with large ports for passing the plasma products therethrough, and gas passages 360 that transmit input gas stream 10(3) through only the side of diffuser 350 that faces process chamber 305. It will be appreciated that the use of any or all of remote plasma source 310 and diffusers 320, 325, 340 and 350 is optional.

A second power supply 150(2) is controllably configured to provide RF energy and/or DC bias to electrodes 210(1) and 210(2) within chuck 170, through connectors 230(1) and 230(2), as schematically shown, and to other parts of processing system 300. Specific connections of the RF energy and/or DC bias may vary, as discussed further below. Power supply 150(2) may provide, for example, DC bias across electrodes 210(1) and 210(2), and may provide RF energy and/or DC bias between electrodes 210(1) and 210(2) and other parts of processing system 300, as indicated by connection 151 between power supply 150(2) and diffuser 350. Providing both RF energy and DC bias is especially useful for both electrostatically clamping wafer 50 (or any other workpiece) to chuck 170, for generating a plasma within process chamber 305, and for directing ions of the plasma to certain processing sites on wafer 50, as discussed further below. Typical DC clamping voltages are ±200V delivered to opposite electrodes 210(1) and 210(2), while typical RF voltages are ±75V across process chamber 305, corresponding to power delivery of about 100-500 W to the plasma. A portion of processing system 300 is shown in greater detail in FIG. 4.

Figure 4:
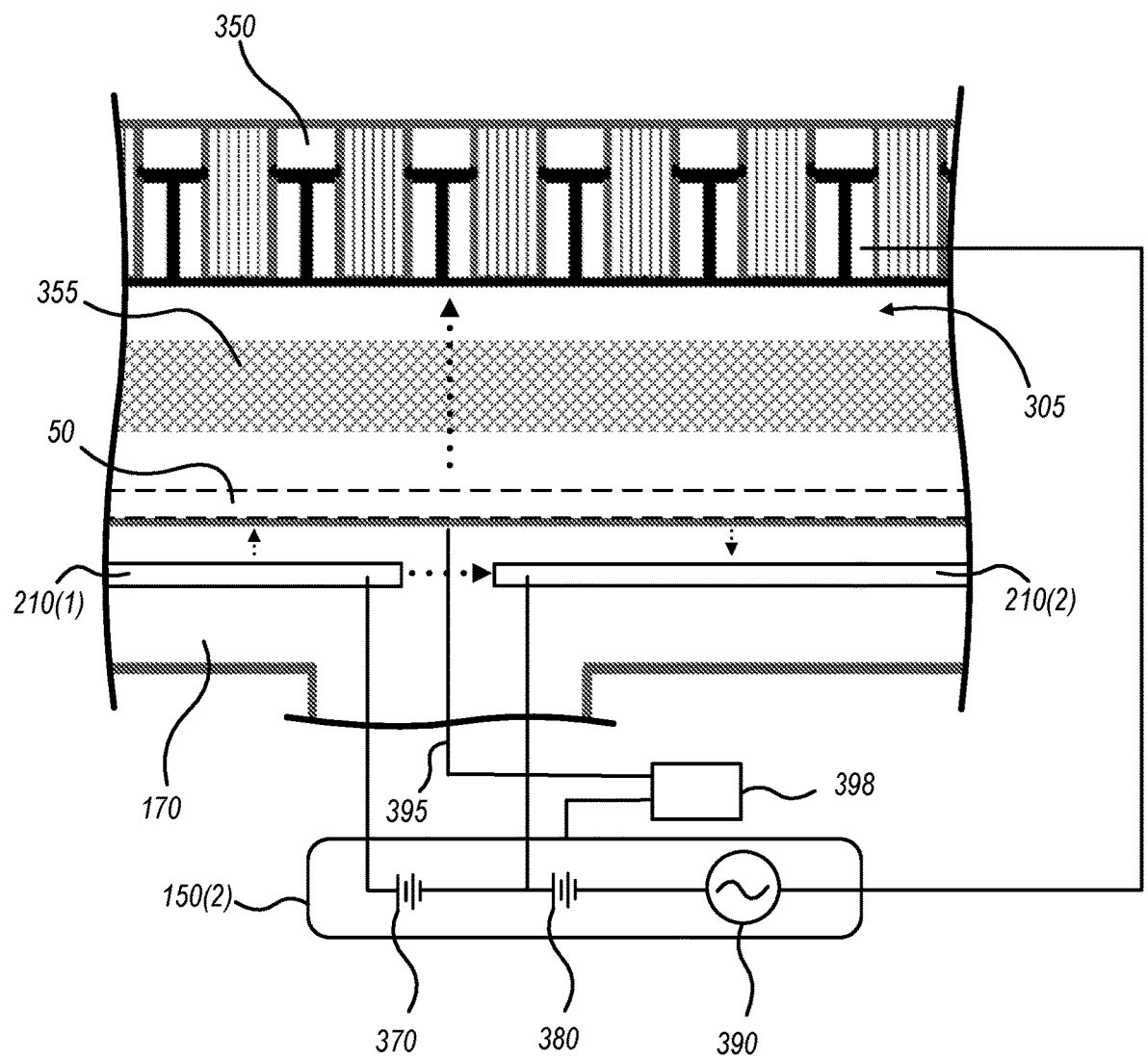
FIG. 4 is a schematic illustration of part of the plasma wafer processing system of FIG. 3, including portions of a wafer chuck and a diffuser therein, and illustrating exemplary power supply connections thereto.

FIG. 4 is a schematic illustration of part of plasma wafer processing system 300 including portions of wafer chuck 170 and diffuser 350, and illustrating exemplary power supply connections thereto. FIG. 4 is not drawn to scale, certain components of plasma wafer processing system 300 are exaggerated or diminished in size, not every instance of each component is labeled, and not all internal connections among components are shown, for illustrative clarity. FIG. 4 shows a portion of process chamber 305 bounded by respective portions of diffuser 350 and chuck 170, wafer 50, a plasma 355 within process chamber 305, and exemplary details of power supply 150(2). Plasma 355 is generated from gas streams 10(1), 10(2) and/or 10(3), either in their original, unactivated forms, or as plasma products formed in remote plasma source 310 or within space 330 (FIG. 3). RF energy for forming plasma 355 is supplied by RF source 390 within power supply 150(2). In the configuration shown in FIG. 4, power supply 150(2) also provides a DC bias 370 across electrodes 210(1) and 210(2), that serves to electrostatically clamp wafer 50 to wafer chuck 170. DC electric fields are shown in FIG. 4 with dotted arrows. The embodiment shown in FIG. 4 also includes an optional DC bias 380 between electrodes 210 and diffuser 350. DC bias 380 can steer ions formed in plasma 355 (or existing in plasma products from other locations, as discussed above) toward wafer 50 to influence directionality of plasma processing on wafer 50 (see FIG. 5).

FIG. 4 also shows a center tap DC probe 395 that can be monitored to determine the actual backside DC voltage of wafer 50. Voltage measured on DC probe 395 can be measured and used to control DC bias 380, in order to control and optimize process results on wafer 50. For example, when plasma processing is performed, reactive species within the plasma products are often negatively charged ions, which can transfer negative charge to wafer 50 when they react. This leads to charging of wafer 50; a typical DC voltage acquired by wafer 50 during processing may be about −50V. Center tap DC probe 395 allows this voltage to be sensed and thus compensated by adjusting DC bias 380 accordingly. Thus, DC probe 395 couples with a high impedance circuit 398 that measures the voltage on DC probe 395 and provides appropriate information for power supply 150(2) to adjust DC bias 380.

All of the components of, and integrated with, wafer chuck 170 are compatible with operation in a temperature range of about 20 C to 150 C, in contrast to earlier systems that may utilize materials that are not compatible with the 20 C to 150 C temperature range, such as certain polymers or plastics, rubber, and the like. The components that are exposed to plasma are also capable of surviving very harsh plasma environments, such as H* or F* radicals, and others, produced when $NH_3$ or $NF_3$ respectively are utilized as source gases. $O_2$ is also commonly added as a source gas (to supply electrons, facilitating plasma initiation) creating further ionic species and radicals. Earlier systems often used stainless steel chucks, but stainless generally corrodes in such environments, causing particulate contamination. The arrangement of wafer chuck 170 within processing system 300 is unique in that it allows for processing to take place at a uniform temperature while also providing firm electrostatic clamping for heat transfer, and the ability to steer reactive ionic species toward the workpiece, without corrosion or thermal degradation. For example, embodiments herein are capable of plasma etching of certain metallic and/or ceramic materials on wafer 50.

Figure 5:
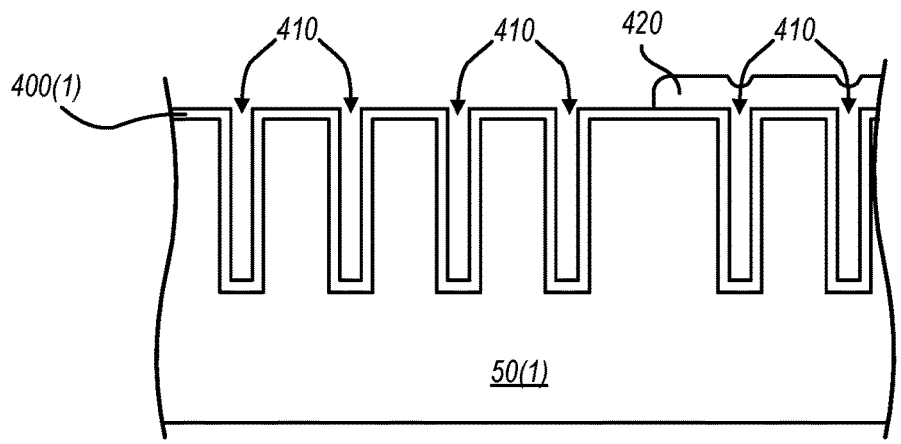
FIG. 5 illustrates a portion of a wafer in process, according to an embodiment.
Figure 6:
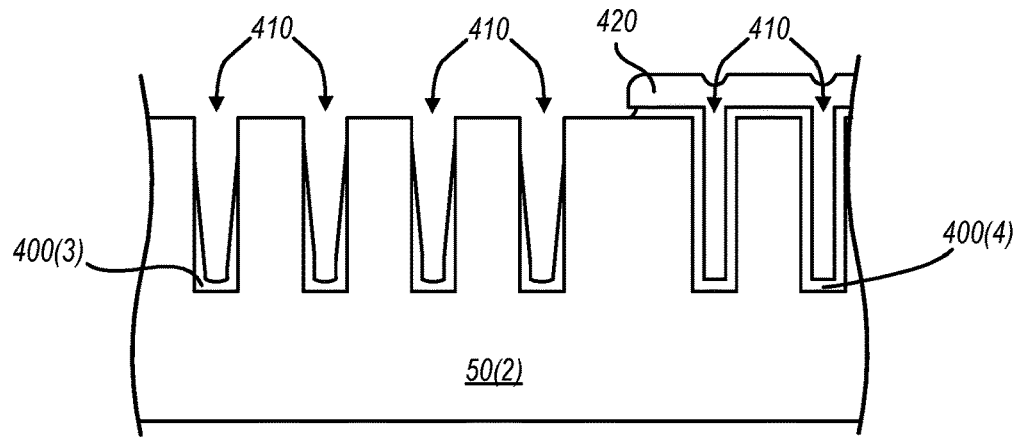
FIG. 6 illustrates a hypothetical result when the wafer portion of FIG. 5 is exposed to a plasma that does not steer ions.
Figure 7:
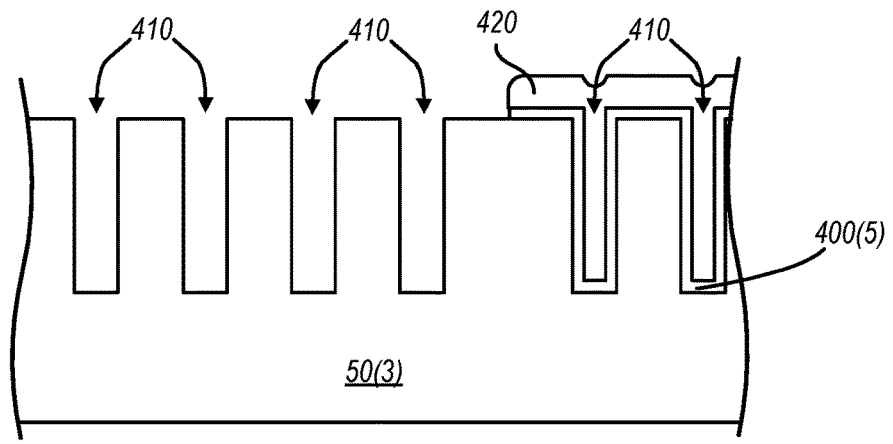
FIG. 7 illustrates the result when the wafer of FIG. 5 is exposed to a plasma that steers ions, according to an embodiment.

FIGS. 5, 6 and 7 illustrate exemplary processing results obtainable with the wafer chucks and wafer processing systems described herein. FIG. 5 illustrates a portion of a wafer 50(1) in process. Wafer 50(1) has already been processed to form deep trenches 410 therein, and a film 400(1) has been deposited on both top surfaces of wafer 50(1) and in trenches 410. Subsequent processing is intended to remove film 400(1) from certain regions of wafer 50(1) but leave film 400(1) on other regions; photoresist 420 is therefore provided in the regions where film 400(1) is to remain.

FIG. 6 illustrates a hypothetical result when wafer 50(1) is exposed to a plasma that does not steer ions, for example by exposing wafer 50(1) to a plasma where reactive species are simply directed randomly by diffusion. Surfaces of film 400(1) that are readily exposed to the reactive species are etched, while wafer 50(1) does not react with the reactive species. This process leaves the resulting wafer 50(2) with film 400(4) protected by photoresist 420, but also leaving residual material 400(3) within trenches 410. This occurs because the reactive species simply travel until they meet something, then react where they land. Few reactive species happen to be traveling in the exact direction required to penetrate deeply into trenches 410. It may or may not be possible, and is usually impractical, to etch wafer 50(1) long enough to remove residual material 400(3) using randomly directed reactive species.

FIG. 7 illustrates the result when wafer 50(1) is exposed to a plasma that steers ions by providing an electric field that directs ions toward wafer 50(1); that is, as shown in FIGS. 3 and 4 using wafer chuck 170. The electric field indicated in FIG. 4 directs negatively charged reactive species downward in the orientation of FIG. 7, such that more of the reactive species reach lower regions of film 400(1) within trenches 410. The resulting wafer 50(3) retains film 400(4) only in locations where original film 400(1) is protected by photoresist 420, as shown.

The design and types of materials used in wafer chucks described herein are not those that would be normally considered for wafer chucks. In the past, wafer chucks have often been quite simple affairs ranging from mere slabs of metal to slightly more complicated systems that provide vacuum or electrostatic clamping, adjustable wafer alignment/positioning, and the like. Designs that retain all of these functions and yet operate with precise cross-wafer temperature control in highly corrosive plasma environments without degradation, are not known.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A wafer chuck assembly, comprising:
   a shaft;
   a puck coupled with the shaft, the puck comprising:
      an electrically insulating material defining a top surface of the puck, wherein the electrically insulating material defines a recessed ledge extending to an outer radius of the electrically insulating material;
      a plurality of electrodes embedded within the electrically insulating material;
      an inner puck element that forms one or more channels for a heat exchange fluid; and
      an electrically conductive plate comprising a body disposed in contact with the inner puck element and defining a recessed cavity, wherein the inner puck element is seated within the recessed cavity, wherein the electrically conductive plate defines an outer radius of the puck, and wherein the electrically conductive plate defines an exterior housing of the shaft; and
   a ring element seated atop the top surface of the puck, the ring element comprising a body extending about the puck, wherein a first downward-facing portion of the ring element is disposed on and in contact with the recessed ledge of the electrically insulating material and a second downward-facing portion of the ring element is disposed on and in contact with an upward-facing portion of the electrically conductive plate defining the recessed cavity within the electrically conductive plate.

2. The wafer chuck assembly of claim 1, further comprising:
   an electrically conductive base housing extending about the shaft housing.

3. The wafer chuck assembly of claim 2, wherein:
   the electrically conductive base housing defines one or more channels for the heat exchange fluid.

4. The wafer chuck assembly of claim 2, further comprising:
   an electrically insulating terminal block disposed within the electrically conductive base housing.

5. The wafer chuck assembly of claim 4, wherein:
   the terminal block comprises polyether ether ketone.

6. The wafer chuck assembly of claim 1, wherein:
   the shaft comprises a plurality of connectors comprising electrical connectors for the electrodes.

7. The wafer chuck assembly of claim 6, wherein:
   the plurality of connectors further comprise one or more connectors for a thermocouple or a resistance temperature detector.

8. The wafer chuck assembly of claim 6, wherein:
   the plurality of connectors further comprise one or more fluid conduits.

9. The wafer chuck assembly of claim 8, wherein:
   at least one of the one or more fluid conduits is configured to provide a heat transfer gas; and
   the electrically insulating material defines channels for the heat transfer gas to spread between the top surface and a bottom surface of a wafer.

10. The wafer chuck assembly of claim 6, wherein:
    each of the electrical connectors for the plurality of electrodes comprises an inner conductor, an insulating layer about the inner conductor, a ground tube about the insulating layer, and a ceramic tube about the ground tube.

11. The wafer chuck assembly of claim 6, further comprising:
    a DC probe that extends through the top surface of the puck, wherein the plurality of connectors further comprise a connector for the DC probe.

12. The wafer chuck assembly of claim 1, further comprising:
    a connective element disposed between the inner puck element and the electrically insulating material.

13. The wafer chuck assembly of claim 12, wherein:
    the connective element is at least partially seated within the cavity of the electrically conductive plate.

14. The wafer chuck assembly of claim 12, wherein:
    the connective element extends fully across a surface of the inner puck element facing the electrically insulating material.

15. The wafer chuck assembly of claim 12, wherein:
    the connective element comprises aluminum silicon carbide.

16. The wafer chuck assembly of claim 1, wherein:
    the one or more channels each comprise a spiral configuration.

17. The wafer chuck assembly of claim 1, wherein:
    the exterior housing of the shaft forms an outer surface of the shaft; and the shaft comprises a ceramic liner disposed within the exterior housing of the shaft that electrically insulates internal components of the shaft from the exterior housing of the shaft.

18. The wafer chuck assembly of claim 17, wherein:

the ceramic liner is integrally formed with the inner puck element.

19. The wafer chuck assembly of claim 1, wherein:

each of the one or more channels defines an internal fin.

* * * * *